(12) United States Patent
Inden et al.

(10) Patent No.: US 11,201,219 B2
(45) Date of Patent: Dec. 14, 2021

(54) INTEGRATED CIRCUIT DEVICE AND METHOD OF MANUFACTURING INTEGRATED CIRCUIT DEVICE

(71) Applicant: Toshiba Memory Corporation, Minato-ku (JP)

(72) Inventors: Tomoya Inden, Yokkaichi (JP); Katsuyuki Kitamoto, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 161 days.

(21) Appl. No.: 16/492,342

(22) PCT Filed: Mar. 12, 2019

(86) PCT No.: PCT/JP2019/009924
§ 371 (c)(1),
(2) Date: Sep. 9, 2019

(87) PCT Pub. No.: WO2020/054109
PCT Pub. Date: Mar. 19, 2020

(65) Prior Publication Data
US 2021/0167176 A1    Jun. 3, 2021

(30) Foreign Application Priority Data
Sep. 14, 2018  (JP) .............................. JP2018-172830

(51) Int. Cl.
*H01L 29/417* (2006.01)
*H01L 23/535* (2006.01)
(Continued)

(52) U.S. Cl.
CPC ...... *H01L 29/41725* (2013.01); *H01L 23/535* (2013.01); *H01L 27/11286* (2013.01); *H01L 27/11293* (2013.01); *H01L 29/401* (2013.01)

(58) Field of Classification Search
CPC ................. H01L 29/41725; H01L 27/11293
See application file for complete search history.

(56) References Cited

U.S. PATENT DOCUMENTS

2005/0051851 A1    3/2005   Chen et al.
2007/0252201 A1   11/2007   Kito et al.
(Continued)

FOREIGN PATENT DOCUMENTS

| JP | 200524087 A | 7/2005 |
|----|-------------|--------|
| JP | 2007-266143 A | 10/2007 |

(Continued)

OTHER PUBLICATIONS

International Search Report dated May 28, 2019 in PCT/JP2019/009924 filed on Mar. 12, 2019 (with Translation of Category of Cited Documents in attached foreign language Search Report).

*Primary Examiner* — Farun Lu
(74) *Attorney, Agent, or Firm* — Oblon, McClelland, Maier & Neustadt, L.L.P.

(57) ABSTRACT

An integrated circuit device of an embodiment includes a substrate, a first transistor, an insulation layer, a first contact, a second contact, and a first single crystal portion. The first transistor includes a first gate electrode, and a first drain region, and wherein the first source region and the first drain region are disposed in the substrate. The first contact faces the first gate electrode. The second contact faces a first region that is first one of the first source region and the first drain region. The first single crystal portion is disposed on the first region and convex from a surface of the first region, and is located between the first region and the second contact.

15 Claims, 29 Drawing Sheets

(51) Int. Cl.
*H01L 27/112* (2006.01)
*H01L 29/40* (2006.01)

(56) References Cited

U.S. PATENT DOCUMENTS

| | | | |
|---|---|---|---|
| 2008/0116583 | A1 | 5/2008 | Yuki |
| 2009/0294836 | A1 | 12/2009 | Kiyotoshi |
| 2011/0291168 | A1 | 12/2011 | Iwasa |
| 2015/0236038 | A1* | 8/2015 | Pachamuthu ..... H01L 27/11524 257/326 |
| 2016/0351709 | A1* | 12/2016 | Nishikawa ...... H01L 21/823418 |
| 2017/0162592 | A1* | 6/2017 | Nishikawa .............. H01L 28/20 |
| 2018/0083044 | A1* | 3/2018 | Yamamoto .......... H01L 29/0653 |
| 2018/0090511 | A1 | 3/2018 | Nakajima |
| 2018/0247954 | A1* | 8/2018 | Amano ............. H01L 21/76877 |

FOREIGN PATENT DOCUMENTS

| | | |
|---|---|---|
| JP | 2008-130756 A | 6/2008 |
| JP | 2009-295694 A | 12/2009 |
| JP | 2011-253857 A | 12/2011 |
| JP | 2018-49968 A | 3/2018 |

\* cited by examiner

INTEGRATED CIRCUIT DEVICE AND METHOD OF MANUFACTURING INTEGRATED CIRCUIT DEVICE

TECHNICAL FIELD

Embodiments of the present invention relate to integrated circuit devices and a method of manufacturing the integrated circuit device.

Priority is claimed on Japanese Patent Application No. 2018-172830, filed Sep. 14, 2018, the content of which is incorporated herein by reference.

BACKGROUND ART

A NAND flash memory in which memory cells are three-dimensionally stacked is known.

CITATION LIST

Patent Literature

[Patent Document 1] Japanese Unexamined Patent Application, First Publication No. 2018-49968

SUMMARY OF INVENTION

Technical Problem

The problem to be solved by the present invention is to provide an integrated circuit device capable of improving an operation speed.

Solution to Problem

An integrated circuit device of an embodiment includes a substrate, a first transistor, an insulation layer, a first contact, a second contact, and a first single crystal portion. The first transistor includes a first gate electrode, a first source region and a first drain region, and the first source region and the first drain region are disposed in the substrate. The first contact is in the insulation layer and faces the first gate electrode. The second contact is in the insulation layer and faces a first region that is one of the first source region and the first drain region. The first single crystal portion is disposed on the first region and is convex from a surface of the first region, and is located between the first region and the second contact.

DESCRIPTION OF EMBODIMENTS

Figure 1:
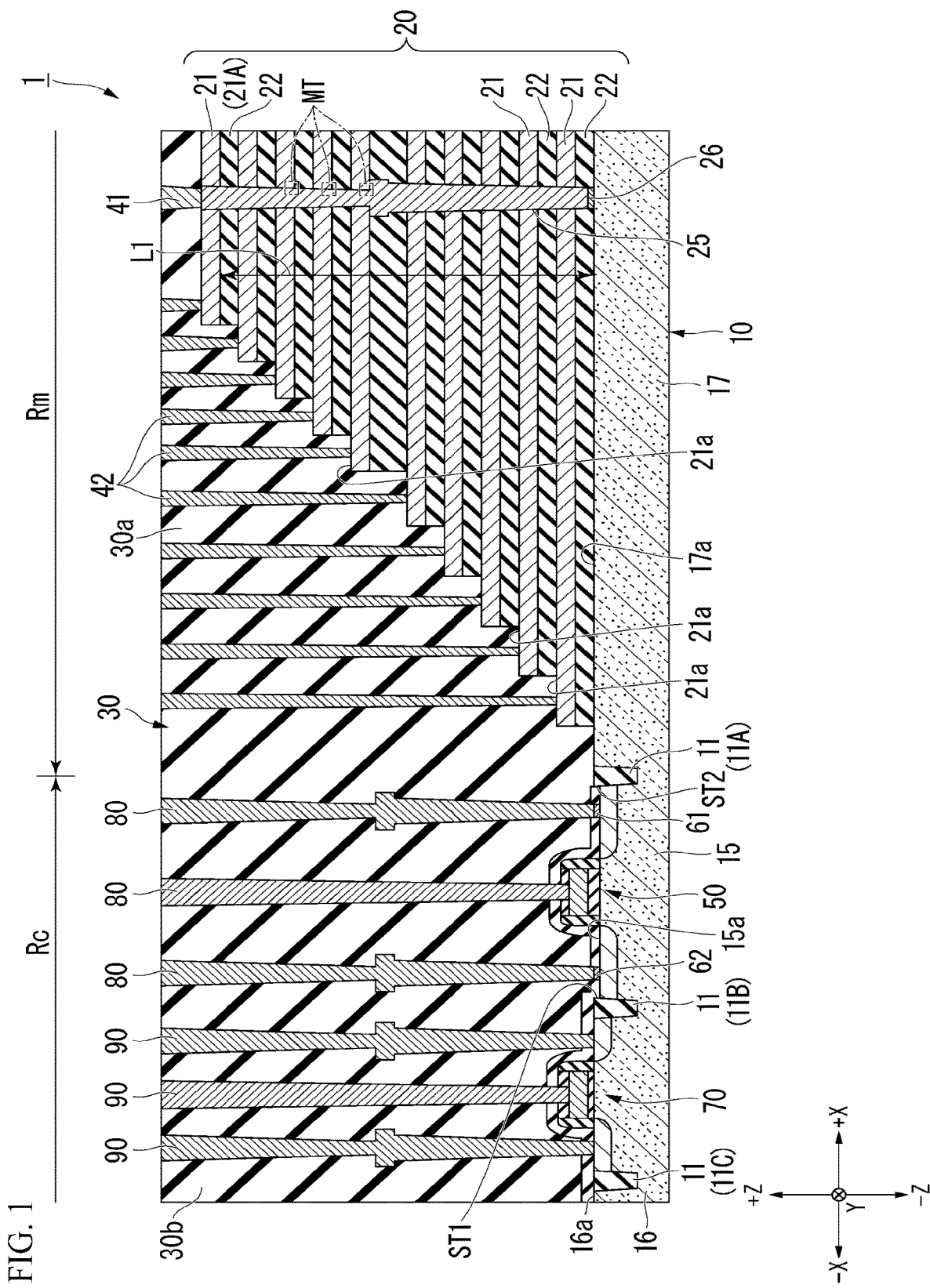
FIG. 1 is a cross-sectional view showing an integrated circuit device according to a first embodiment.

Hereinafter, an integrated circuit device according to an embodiment will be described with reference to the drawings. The drawings are schematic or conceptual, and a relationship between a thickness and a width of each portion, a ratio between sizes of portions, or the like is not necessarily the same as an actual one. In the following description, configurations having the same or similar functions are denoted by the same reference numerals. Repeated description thereof may be omitted.

First, a +X direction, a −X direction, a Y direction, a +Z direction, and a −Z direction are defined. The +X direction, the −X direction, and the Y direction are directions substantially parallel to a surface 15a of a semiconductor substrate 10 (see FIG. 1) to be described below. The +X direction is a direction from a circumferential circuit region Rc to be described below toward a memory region Rm. The −X direction is a direction opposite to the +X direction. When the +X direction and the −X direction are not distinguished, the +X direction and the −X direction are simply referred to as an "X direction". The Y direction is a direction crossing (for example, substantially orthogonal to) the X direction. The +Z direction and the −Z direction are directions crossing (for example, substantially orthogonal to) the X direction and the Y direction. The +Z direction is a direction from the semiconductor substrate 10 to a stack 20. The −Z direction is a direction opposite to the +Z direction. When the +Z direction and the −Z direction are not distinguished, the +Z direction and the −Z direction are simply referred to as a "Z direction". In the present specification, the "+Z direction" may be referred to as "upward", and the "−Z direction" may be referred to as "downward". However, these representations are for convenience and do not define a direction of gravity. In the embodiment, the +Z direction is an example of a "first direction". The +X direction is an example of a "second direction".

In the present specification, "connection" is not limited to physical connection and includes electrical connection. In the present specification, "facing" expresses a state that two members are in contact with each other, or that another member is present between the two members. In the present specification, "target disposed in the substrate (or a substrate portion)" refers to that at least a portion of the target is in the substrate or that at least a portion of the target is project from the substrate.

First Embodiment

An integrated circuit device 1 of the first embodiment will be described. FIG. 1 is a cross-sectional view showing the integrated circuit device 1 of the embodiment. The integrated circuit device 1 is, for example, a non-volatile semiconductor storage device, and is, for example, a NAND flash memory.

The integrated circuit device 1 includes, for example, a semiconductor substrate 10, the stack 20, a plurality of columns 25, a plurality of single crystal portions 26, an insulation layer 30, a plurality of contacts 41, a plurality of contacts 42, a plurality of transistors 50 and 70, a plurality of single crystal portions 61 and 62, and a plurality of contacts 80 and 90. In FIG. 1, only one column 25, one single crystal portion 26, and one contact 41 are shown as a representative.

The semiconductor substrate 10 is a silicon substrate containing single crystal silicon. A plurality of element isolation and insulation regions 11 (STI: Shallow Trench Isolation; hereinafter referred to as an "element isolation portions 11") made of, for example, silicon oxide are in a portion of an upper area of the semiconductor substrate 10. The plurality of element isolation portions 11 include a first element isolation portion 11A, a second element isolation portion 11B, and a third element isolation portion 11C. The first element isolation portion 11A is at a boundary between the memory region Rm and the circumferential circuit region Rc to be described below. The second element isolation portion 11B is between a first transistor 50 and a second transistor 70. The third element isolation portion 11C is on the side opposite to the second element isolation portion 11B with respect to the second transistor 70.

The semiconductor substrate 10 has a first substrate portion 15, a second substrate portion 16, and a third substrate portion 17. The second substrate portion 16 and the third substrate portion 17 are greater in thickness defined in the Z direction than the first substrate portion 15. There are steps ST1 and ST2 from differences in thickness in the Z direction between the first substrate portion 15 and the second substrate portion 16 and between the third substrate portion 17 and the second substrate portion 16. The surface (upper surface) 15a of the first substrate portion 15 is lower in level than a surface (upper surface) 16a of the second substrate portion 16 and also than a surface (upper surface) 17a of the third substrate portion 17. Accordingly, for example, a difference in thickness between a first gate insulation film 54 of the first transistor 50 and a second gate insulation film 74 of the second transistor 70 corresponds to a height of step ST1 (see FIG. 3). However, the reason for provision of the steps ST1 and ST2 is not limited to the above example.

The memory region Rm is a region in which a plurality of memory cell transistors MT are disposed. The memory region Rm is on the third substrate portion 17 in the semiconductor substrate 10. The memory cell region Rm includes, for example, the stack 20, a plurality of columns 25, the plurality of single crystal portions 26, a first portion 30a of the insulation layer 30, the plurality of contacts 41, and the plurality of contacts 42.

The stack 20 includes a plurality of conductive films 21 and a plurality of insulation films 22. The conductive films 21 and the insulation films 22 are alternately stacked in the Z direction. The insulation film 22 is, for example, silicon oxide. The conductive film 21 is, for example, tungsten. For example, an end shape in the −X direction of the stack 20 is a step shape in which a length in the −X direction becomes shorter as the conductive films 21 are located in the +Z direction. Accordingly, an upper surface of each of the conductive films 21 has a terrace 21a that is a region not covered with the insulation film 22.

In the embodiment, a distance (for example, the shortest distance) between a conductive film 21A farthest from the semiconductor substrate 10 among the plurality of conductive films 21 and the first substrate portion 15 in the Z direction is defined as a "first distance L1". The first distance L1 is the distance between a lower surface of the conductive film 21A and a surface (an upper surface) 17a of the third substrate portion 17.

The columns 25 are in the stack 20. The columns 25 extend in the Z direction and penetrate the stack 20, respectively. Each of a lower end of the columns 25 is electrically connected to the semiconductor substrate 10 via the single crystal portions 26 respectively (to be described below) disposed on the semiconductor substrate 10. A detailed configuration of the columns 25 will be described below with reference to FIG. 2.

The single crystal portions 26 are disposed respectively in a region facing the columns 25 in the Z direction of the surface 17a of the third substrate portion 17 of the semiconductor substrate 10. The single crystal portions 26 are disposed on the surface 17a of the third substrate portion 17 and are respectively convex from the surface 17a of the third substrate portion 17. That is, the single crystal portions 26 respectively projects in the +Z direction from the surface 17a of the third substrate portion 17. The single crystal portions 26 are located between the surface 17a of the third substrate portion 17 and the columns 25 respectively and are in contact with the third substrate portion 17 and the columns 25 respectively. The single crystal portions 26 are epitaxial silicon layers formed by epitaxial growth of silicon on the surface 17a of the third substrate portion 17.

The first portion 30a of the insulation layer 30 is located on the opposite side of the stack 20 from the semiconductor substrate 10, and covers the stack 20. The insulation layer 30 is, for example, silicon oxide.

The contacts 41 are disposed on the columns 25, respectively. The "contact" in the present specification is, for example, a connection member in a columnar shape, a truncated cone shape, an inverted truncated cone shape, or a barrel shape formed of a conductive material such as tungsten. The contacts 41 are disposed in the first portion 30a of the insulation layer 30 and extend in the Z direction, respectively. The contacts 41 are electrically connected to the columns 25, respectively. The contacts 41 electrically connect the columns 25 to a conductive interconnection (not shown), respectively.

The plurality of contacts 42 are disposed on the terraces 21a of the plurality of conductive films 21. The contacts 42 are disposed in the first portion 30a of the insulation layer 30 and extend in the Z direction. The contacts 42 are in contact with the terraces 21a of the conductive films 21 and are electrically connected to the conductive films 21, respectively. The plurality of contacts 42 electrically connect the plurality of conductive films 21 to conductive interconnections (not shown).

The circumferential circuit region Rc is a region in which a circumferential circuit for driving the memory region Rm is disposed. The circumferential circuit region Rc is disposed on the first substrate portion 15 and the second substrate portion 16 in the semiconductor substrate 10. The circumferential circuit region Rc includes, for example, a plurality of transistors (the first transistor 50 and the second transistor 70), a plurality of single crystal portions 61 and 62, a second portion 30b of the insulation layer 30, and a plurality of contacts 80 and 90. A detailed configuration of the circumferential circuit region Rc will be described below with reference to FIG. 3.

Figure 2:
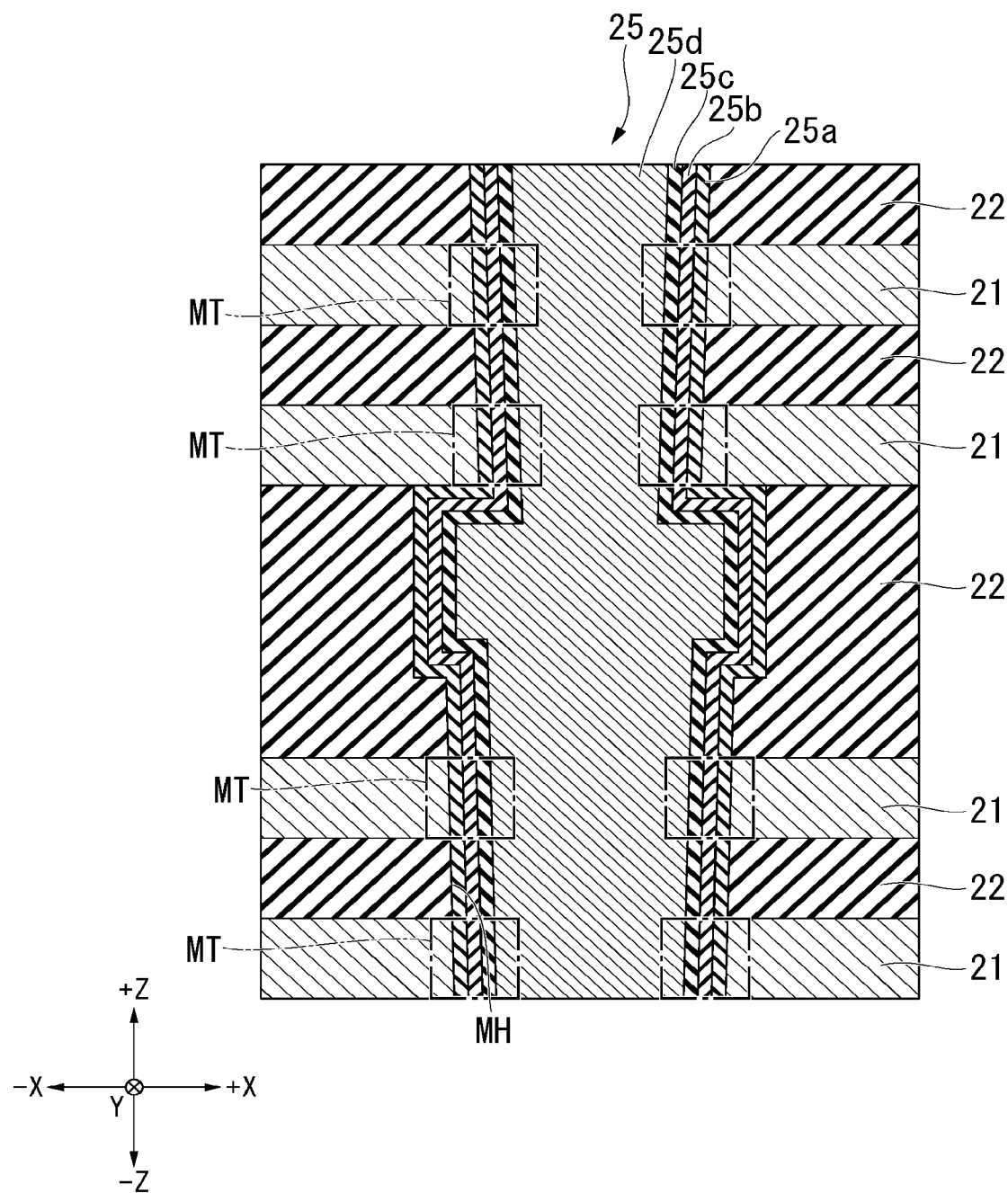
FIG. 2 is a cross-sectional view showing the vicinity of a column of the first embodiment.

FIG. 2 is a cross-sectional view showing a vicinity of the column 25. The column 25 includes a block insulation film 25a, a charge storage film 25b, a tunnel oxide film 25c, and a semiconductor body 25d. The block insulation film 25a is disposed on an inner wall of a memory hole MH, which is a hole penetrating the stack 20 in the Z direction. The charge storage film 25b is disposed on an inner wall of the block insulation film 25a. The tunnel oxide film 25c is disposed on an inner wall of the charge storage film 25b. The semiconductor body 25d is disposed on an inner wall of the tunnel oxide film 25c. The block insulation film 25a, the charge storage film 25b, the tunnel oxide film 25c, and the semiconductor body 25d extends along an outer surface of the column 25, respectively. The column 25 may include different materials inside the semiconductor body 25d. Intersection portions between the column 25 and the plurality of conductive films 21 function as transistors (for example, the memory cell transistors MT), respectively. The memory cell transistor MT holds charge in the charge storage film 25b in a non-volatile manner according to the voltage applied to the conductive film 21.

Figure 3:
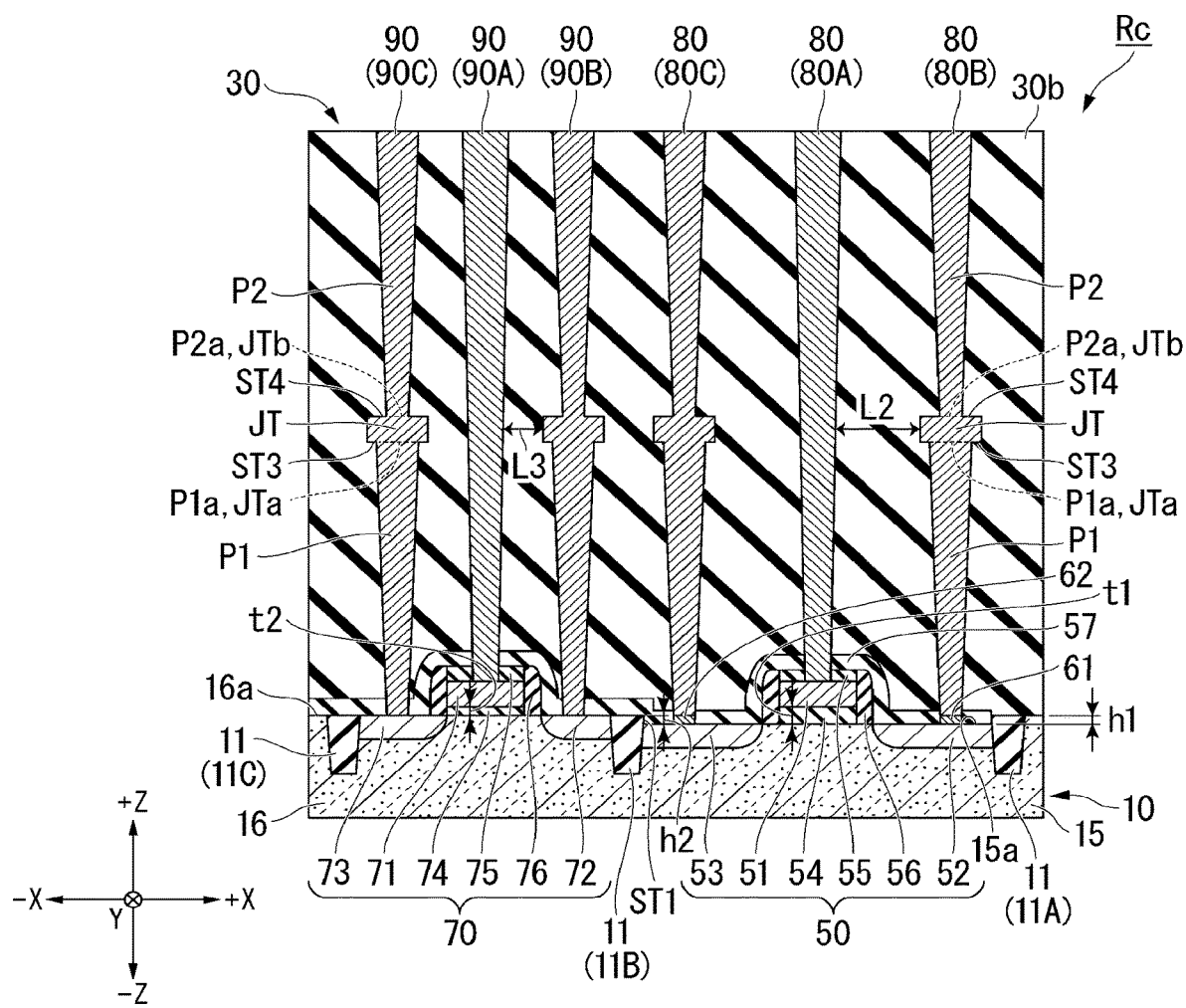
FIG. 3 is a cross-sectional view showing a circumferential circuit region of the integrated circuit device of the first embodiment.

Next, a configuration of circumferential circuit region Rc will be described in detail. FIG. 3 is a cross-sectional view showing the circumferential circuit region Rc.

First, the first transistor 50 will be described. The first transistor 50 is disposed in the first substrate portion 15. The first transistor 50 is a field effect transistor, and is a portion of a circumferential circuit. The first transistor 50 is, for example, a transistor that applies a relatively high voltage for changing a storage state of the memory cell transistor MT to the memory cell transistor MT.

The first transistor 50 is between the first element isolation portion 11A and the second element isolation portion 11B in the X direction. The first transistor 50 includes, for example, a first gate electrode 51, a first source region 52, a first drain region 53, a first gate insulation film 54, an insulation film 55, and an insulation sidewall 56.

The first gate electrode 51 is disposed above the surface 15a of the first substrate portion 15. The first gate electrode 51 is between the first source region 52 and the first drain region 53 in the X direction. The first gate electrode 51 is, for example, polysilicon.

The first source region 52 and the first drain region 53 are portions of an upper area of the first substrate portion 15. The first source region 52 and the first drain region 53 are separated from each other in the X direction. In the embodiment, the first source region 52 and the first drain region 53 include n⁻ type semiconductors respectively. In the present specification, "n⁻ type semiconductor" refers to an n type semiconductor having an impurity concentration of less than $10^{15}$ atoms/cm². As an example, respective impurity concentration of the first source region 52 and the first drain region 53 are $1 \times 10^{12}$ atoms/cm².

The first gate insulation film 54 is disposed on the surface 15a of the first substrate portion 15. At least a portion of the first gate insulation film 54 is between the first gate electrode 51 and the first substrate portion 15. The first gate insulation film 54 is, for example, a silicon oxide film. In the embodiment, a thickness t1 of the first gate insulation film 54 in the Z direction is greater than a thickness t2 of the second gate insulation film 74 in the Z direction.

The insulation film 55 is disposed on the first gate electrode 51 and on the first gate electrode 51 as well as provided in opposite side to the first gate insulation film 54 with respect to the first gate electrode 51. The insulation sidewall 56 covers side surfaces of the first gate electrode 51. The insulation film 55 and the insulation sidewall 56 are, for example, a silicon nitride film. The protective film 57 covers the first gate electrode 51, the insulation film 55, and the insulation sidewall 56 in opposite side to the first substrate portion 15 with respect to these. The protective film 57 is, for example, a silicon nitride film, a silicon oxide film, or a stack of these.

Next, the single crystal portions 61 and 62 will be described. Hereinafter, for convenience of description, the single crystal portion 61 is referred to as a "first single crystal portion 61", and the single crystal portion 62 is referred to as a "second single crystal portion 62".

The first single crystal portion 61 is disposed on a region facing a contact 80B to be described below in the Z direction in the surface 15a of the first substrate portion 15 of the semiconductor substrate 10. The first single crystal portion 61 is disposed on the first source region 52 and is a convex from a surface of the first source region 52, namely the surface 15a of the first substrate portion 15. That is, the first single crystal portion 61 projects in the +Z direction from the surface 15a of the first substrate portion 15. The first single crystal portion 61 is located between the surface 15a of the first substrate portion 15 and the contact 80B, and is connected to be each of the first substrate portion 15 and the contact 80B. The first single crystal portion 61 electrically connects the first substrate portion 15 to the contact 80B.

The second single crystal portion 62 is disposed in a region facing a contact 80C to be described below in the Z direction in the surface 15a of the first substrate portion 15 of the semiconductor substrate 10.

The second single crystal portion 62 is disposed separately (independently) from the first single crystal portion 61. The second single crystal portion 62 is disposed on the first drain region 53, and is convex from a surface of the first drain region 53, namely the surface 15a of the first substrate portion 15. That is, the second single crystal portion 62 projects in the +Z direction from the surface 15a of the first substrate portion 15. The second single crystal portion 62 is located between the surface 15a of the first substrate portion 15 and the contact 80C, and is connected to be each of the first substrate portion 15 and the contact 80C. The second single crystal portion 62 electrically connects the first substrate portion 15 to the contact 80C.

The first and second single crystal portions 61 and 62 are, for example, epitaxial silicon layers formed by epitaxial growth of silicon on the surface 15a of the first substrate portion 15. The first and second single crystal portions 61 and 62 contains, for example, an impurity as a donor or an acceptor, respectively. In the embodiment, the first and second single crystal portions 61 and 62 contain an impurity as a donor, and have, for example, an n⁻ type semiconductor. In the embodiment, a respective height h1 of the first and second single crystal portions 61 and 62 in the Z direction is equal to or smaller than a height h2 in the Z direction of the step ST1 at a boundary between the first substrate portion 15 and the second substrate portion 16. The respective height h1 of the first and second single crystal portions 61 and 62 in the Z direction may be greater than the height h2 in the Z direction of the step ST1.

Next, the second transistor 70 will be described. The second transistor 70 is disposed on the second substrate portion 16. The second transistor 70 is a field effect transistor, and is a portion of a circumferential circuit. A maximum voltage of a current flowing through the second transistor 70 is smaller than a maximum voltage of a current flowing through the first transistor 50.

The second transistor 70 is between the second element isolation portion 11B and the third element isolation portion 11C in the X direction. The second transistor 70 includes, for example, a second gate electrode 71, a second source region 72, a second drain region 73, a second gate insulation film 74, an insulation film 75, and an insulation sidewall 76.

The second gate electrode 71 is disposed above a surface 16a of the second substrate portion 16. The second gate electrode 71 is between the second source region 72 and the second drain region 73 in the X direction. The second gate electrode 71 is, for example, polysilicon.

The second source region 72 and the second drain region 73 are portions of an upper area of the second substrate portion 16. The second source region 72 and the second drain region 73 are separated from each other in the X direction. In the embodiment, the second source region 72 and the second drain region 73 include n⁺ type semiconductors or a p type semiconductors (for example, a p⁺ type semiconductor), respectively. In the present specification, the "n⁺ type semiconductor" refer to an n type semiconductor having an impurity concentration of $10^{15}$ atoms/cm² or more.

The second gate insulation film 74 is disposed on the surface 16a of the second substrate portion 16. At least a portion of the second gate insulation film 74 is between the second gate electrode 71 and the second substrate portion 16. The second gate insulation film 74 is, for example, a silicon oxide film.

The insulation film 75 is disposed on the second gate electrode 71 and on the second gate electrode 71 as well as provided in opposite side to the second gate insulation film 74 with respect to the second gate electrode 71. The insulation sidewall 76 covers side surfaces of the second gate electrode 71. The insulation film 75 and the insulation sidewall 76 are, for example, a silicon oxide. The protective film 57 described above covers the second gate electrode 71, the insulation film 75, and the insulation sidewall 76 in the opposite side to the second substrate portion 16 with respect to these.

The second portion 30b of the insulation layer 30 is located above the first and second transistors 50 and 70 and covers the first and second transistors 50 and 70.

Next, the plurality of contacts 80 will be described. The plurality of contacts 80 are disposed in the insulation layer 30. The plurality of contacts 80 are, for example, tungsten. The plurality of contacts 80 include a contact 80A, a contact 80B, and a contact 80C. The contact 80A, the contact 80B, and the contact 80C are examples of a "first contact", a "second contact", and a "third contact", respectively.

The contact 80A is disposed on the first gate electrode 51. The contact 80A extends in the Z direction and faces the first gate electrode 51. The contact 80A penetrates the protective film 57 and the insulation film 55 to be in direct contact with the first gate electrode 51, and is electrically connected to the first gate electrode 51.

In the Z direction, the contact 80A continuously changes in widths in the X direction and the Y direction within a range of the first distance L1 from the surface 15a of the first substrate portion 15. The "changing continuously" in the present specification means that the contact does not have a step in which the width of the contact changes discontinuously. For example, in case that lines which are defined by crosses of a side surface of the contact and XZ plane are a continuous straight line or curve, the side surface changes continuously.

The contact 80B is disposed above the first source region 52. The contact 80B extends in the Z direction and faces the first single crystal portion 61 disposed on the first source region 52. The contact 80B penetrates the protective film 57 halfway to be in contact with the first single crystal portion 61, and is electrically connected to the first source region 52 via the first single crystal portion 61.

The contact 80C is disposed above the first drain region 53. The contact 80C extends in the Z direction and faces the second single crystal portion 62 disposed on the first drain region 53. The contact 80C penetrates the protective film 57 halfway to be in contact with the second single crystal portion 62, and is electrically connected to the first drain region 53 via the second single crystal portion 62.

The contacts 80B and 80C includes a first columnar portion P1, a junction portion JT, and a second columnar portion P2, respectively. The first columnar portion P1, the junction portion JT, and the second columnar portion P2 are examples of a first portion, a second portion, and a third portion of the contact, respectively. The first columnar portion P1, the junction portion JT, and the second columnar portion P2 are disposed in this order in the +Z direction. A shape of the first columnar portion P1 and the second columnar portion P2 is a columnar shape, a truncated cone shape, an inverted truncated cone shape, or a barrel shape, respectively. The first columnar portion P1 has an upper end P1a that is in contact with the junction portion JT. The junction portion JT has a lower end JTa that is in contact with the first columnar portion P1. Respective widths of the lower end JTa of the junction portion JT in the X direction and the Y direction are greater than widths of the upper end P1a of the first columnar portion P1 in the X direction and the Y direction, respectively. Therefore, there is a step ST3 at a boundary between the first columnar portion P1 and the junction portion JT.

On the other hand, the junction portion JT has an upper end JTb that is in contact with the second columnar portion P2. The second columnar portion P2 has a lower end P2a that is in contact with the junction portion JT. Respective widths of the lower end P2a of the second columnar portion P2 in the X direction and the Y direction are smaller than widths of the upper end JTb of the junction portion JT in the X direction and the Y direction, respectively. Therefore, there is a step ST4 at a boundary between the junction portion JT and the second columnar portion P2. There are the steps ST3 and ST4 in a range of the first distance L1 from the surface 15a of the first substrate portion 15 in the Z direction. The contacts 80B and 80C change discontinuously in widths in the X direction and the Y direction at the steps ST3 and ST4. The upper end JTb of the junction portion JT is an example of a "first end". The lower end P2a of the second columnar portion P2 is an example of a "second end".

Next, the plurality of contacts 90 will be described. The plurality of contacts 90 are disposed in the insulation layer 30. The plurality of contacts 90 are, for example, tungsten. The plurality of contacts 90 include a contact 90A, a contact 90B, and a contact 90C. The contact 90A, the contact 90B, and the contact 90C are examples of a "fourth contact", a "fifth contact", and a "sixth contact", respectively.

The contact 90A is disposed on the second gate electrode 71. The contact 90A extends in the Z direction and faces the second gate electrode 71. The contact 90A penetrates the protective film 57 and the insulation film 75 to be in direct contact with the second gate electrode 71, and is electrically connected to the second gate electrode 71. In the Z direction the contact 90A continuously changes in widths in the X direction and the Y direction change within a range of the first distance L1 from the surface 16a of the second substrate portion 16.

The contact 90B is disposed on the second source region 72. The contact 90B extends in the Z direction and faces the second source region 72. The contact 90B penetrates the protective film 57 to be in direct contact with the second source region 72, and is electrically connected to the second source region 72.

The contact 90C is disposed on the second drain region 73. The contact 90C extends in the Z direction and faces the second drain region 73. The contact 90C penetrates the protective film 57 to be in direct contact with the second drain region 73, and is electrically connected to the second drain region 73.

Respective the contacts 90B and 90C include a first columnar portion P1, a junction portion JT, and a second columnar portion P2, like the contacts 80B and 80C. There are steps ST3 and ST4 at a boundary between the first columnar portion P1 and the junction portion JT and a boundary between the junction portion JT and the second columnar portion P2 in the contacts 90B and 90C, respectively. There are steps ST3 and ST4 in a range of the first distance L1 from the surface 16a of the second substrate portion 16 in the Z direction, respectively. Respective the contacts 90B and 90C change discontinuously at the steps ST3 and ST4 in widths in the X direction and the Y direction.

In the embodiment, a shortest distance L3 in the X direction between the contact 90B (or the contact 90C) and the contact 90A is shorter than a shortest distance L2 in the X direction between the contact 80B (or the contact 80C) and the contact 80A.

Next, a method of manufacturing the integrated circuit device 1 of the first embodiment will be described. FIGS. 4 to 12 are cross-sectional views showing an example of a method of manufacturing the integrated circuit device 1.

Figure 4:
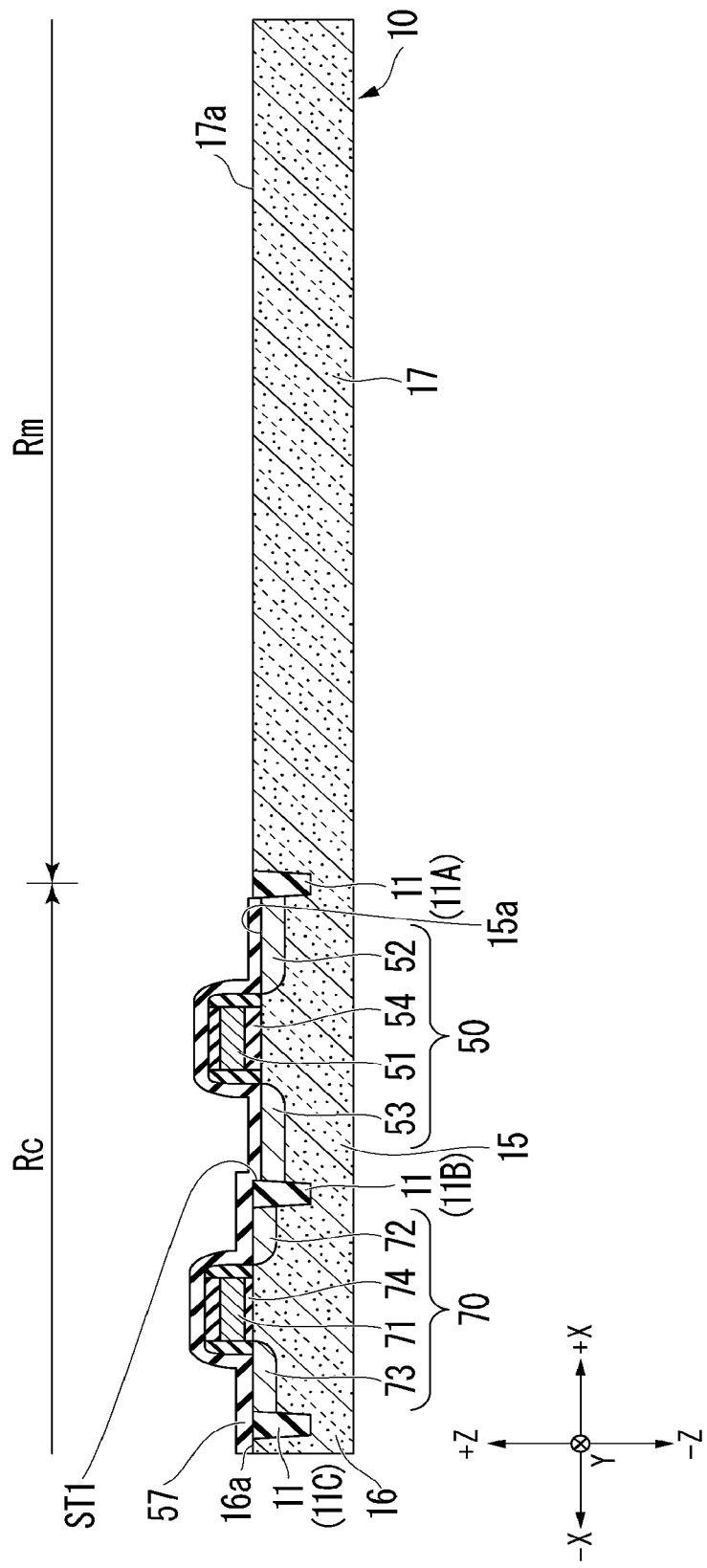
FIG. 4 is a cross-sectional view showing a method of manufacturing the integrated circuit device of the first embodiment.

As shown in FIG. 4, first, a region corresponding to the first substrate portion 15 in the semiconductor substrate 10 is thinned by etching or the like. Accordingly, the first substrate portion 15 is brought one step lower than the second substrate portion 16 and the third substrate portion 17, respectively. Then, the plurality of element isolation insulation films 11, the first transistor 50, the second transistor 70, and the protective film 57 are formed using, for example, a known method. For example, the source regions 52 and 72 and the drain regions 53 and 73 are formed by ions of an impurity serving as donors or acceptors being implanted into the semiconductor substrate 10, respectively.

Figure 5:
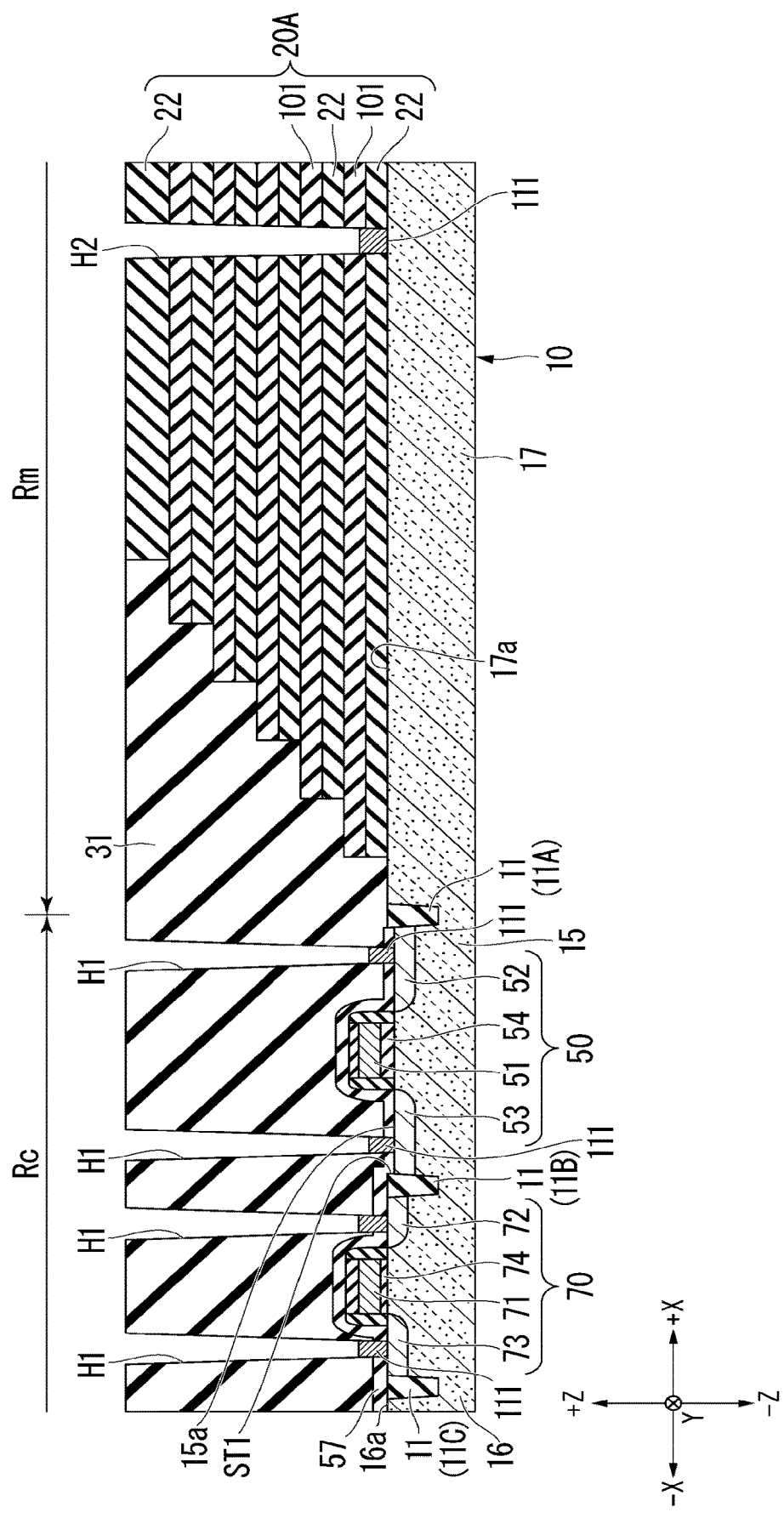
FIG. 5 is a cross-sectional view showing the method of manufacturing the integrated circuit device of the first embodiment.

Then, a first stack 20A in which the insulation films 22 and replacement materials 101 are alternately stacked is formed in a region corresponding to the memory region Rm on the semiconductor substrate 10, as shown in FIG. 5. The replacement material 101 is, for example, a nitride film such as silicon nitride. Then, the first insulation layer 31 is formed to cover the first stack 20A, the first transistor 50, and the second transistor 70. The first insulation layer 31 is formed, for example, by using a chemical vapor deposition method and is planarized by chemical mechanical polishing (CMP).

Then, first holes H1 are formed in the first insulation layer 31. Respective the first holes H1 are formed from an upper surface of the first insulation layer 31 to surfaces of the first source region 52, the first drain region 53, the second source region 72, and the second drain region 73, and reach the surfaces. Further, second holes H2 are formed in the first stack 20A. The first and second holes H1 and H2 are processed using, for example, a lithography method or a reactive ion etching (RIE) method. The first and second holes H1 and H2 are formed substantially simultaneously.

Then, silicon single crystals are carried out epitaxial growth in the first and second holes H1 and H2. Accordingly, a single crystal portions 111 are formed at lower end portions of the first and second holes H1 and H2. The single crystal portions 111 in the first holes H1 and the single crystal portion 111 in the second holes H2 are formed substantially simultaneously.

Figure 6:
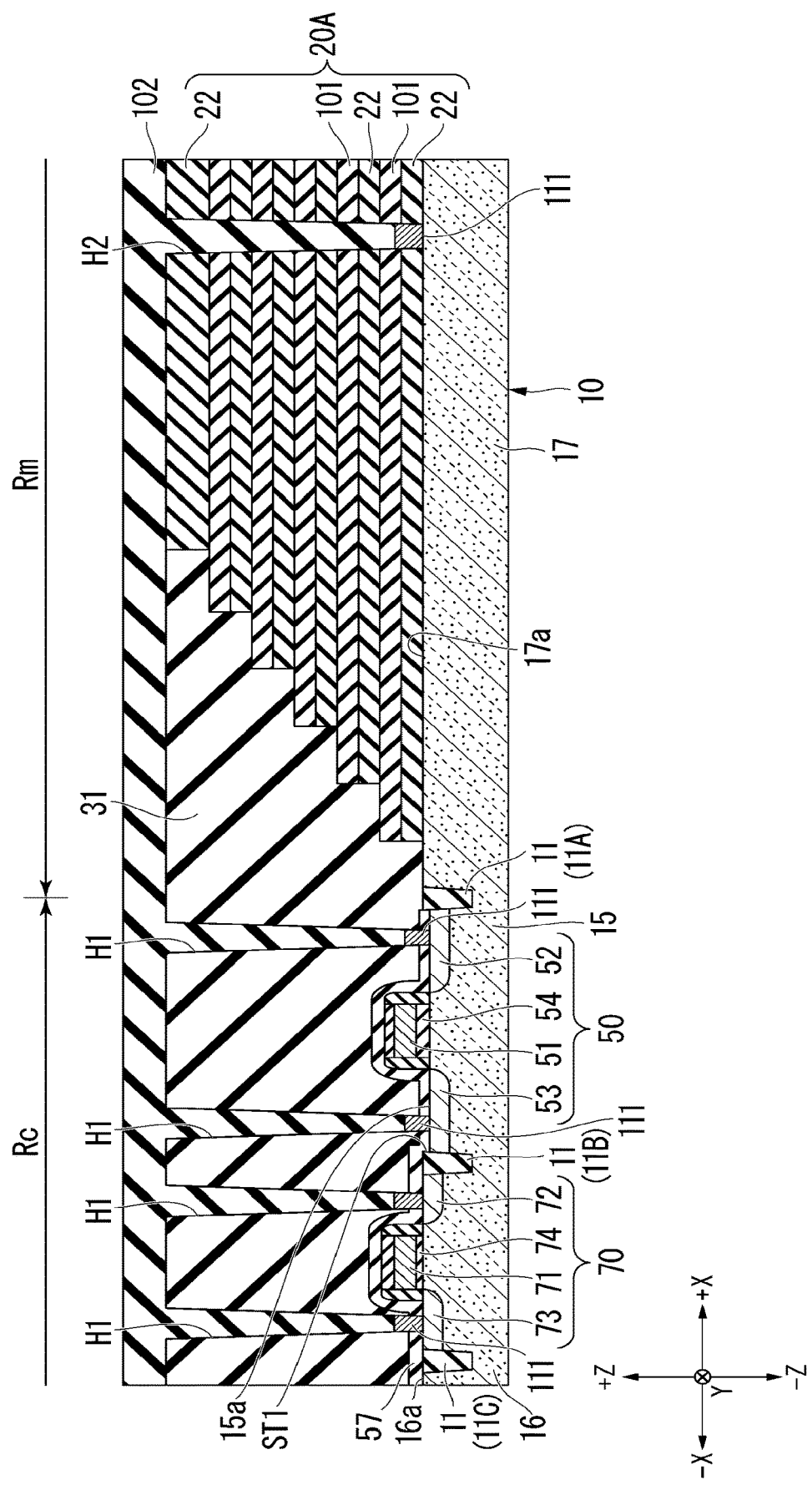
FIG. 6 is a cross-sectional view showing the method of manufacturing the integrated circuit device of the first embodiment.

Then, a sacrificial material 102 is provided inside and on upper surfaces of the first and second holes H1 and H2, as shown in FIG. 6. The sacrificial material 102 is, for example, amorphous silicon.

Figure 7:
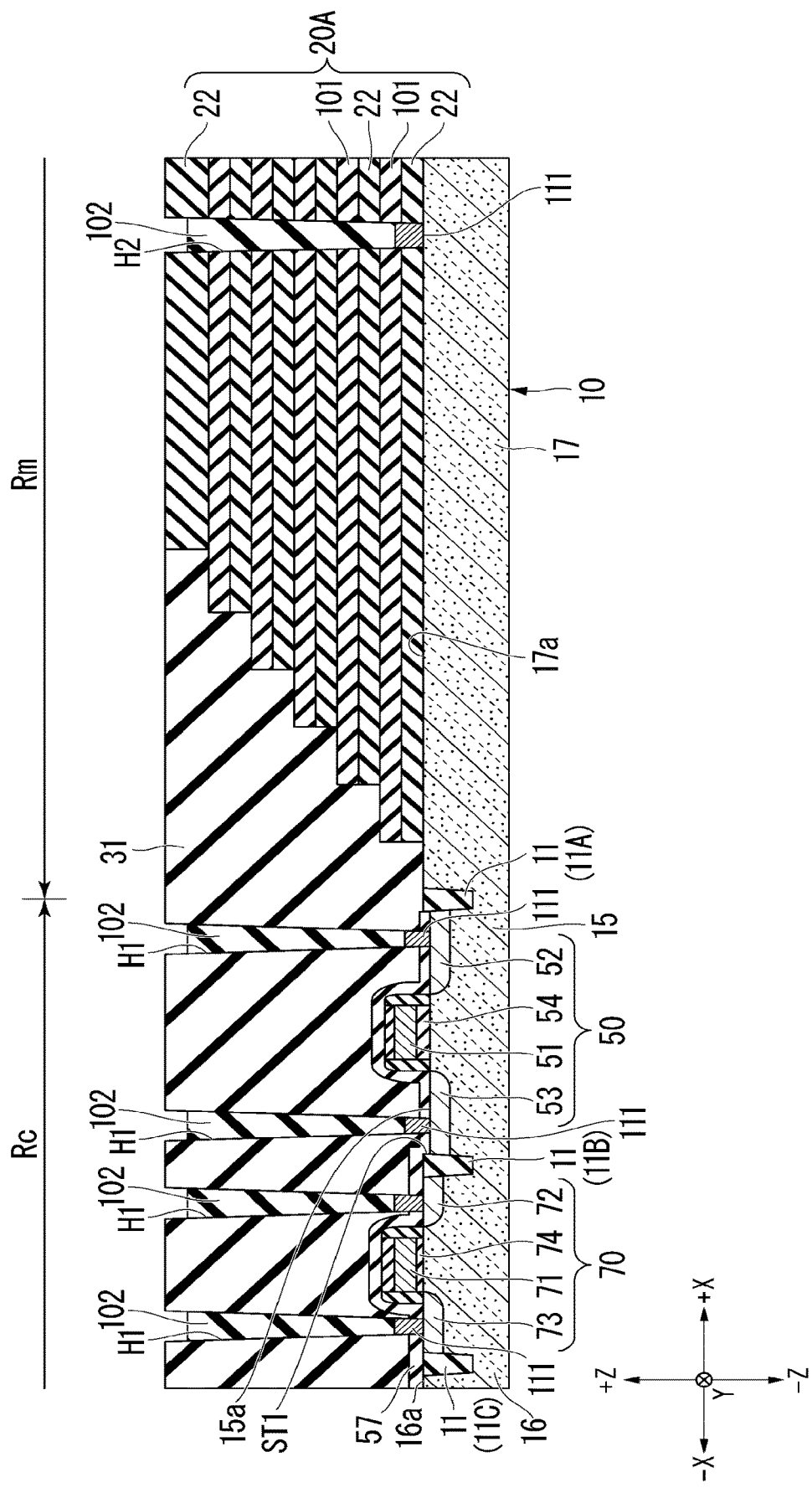
FIG. 7 is a cross-sectional view showing the method of manufacturing the integrated circuit device of the first embodiment.

Then, the sacrificial material 102 is etched back using an RIE method, as shown in FIG. 7. Accordingly, the sacrificial material 102 disposed on the insulation layer 30 is removed. Further, sacrificial materials 102 formed inside the first and second holes H1 and H2 are removed in a range in which the replacement material 101 of the uppermost layer is not exposed.

Figure 8:
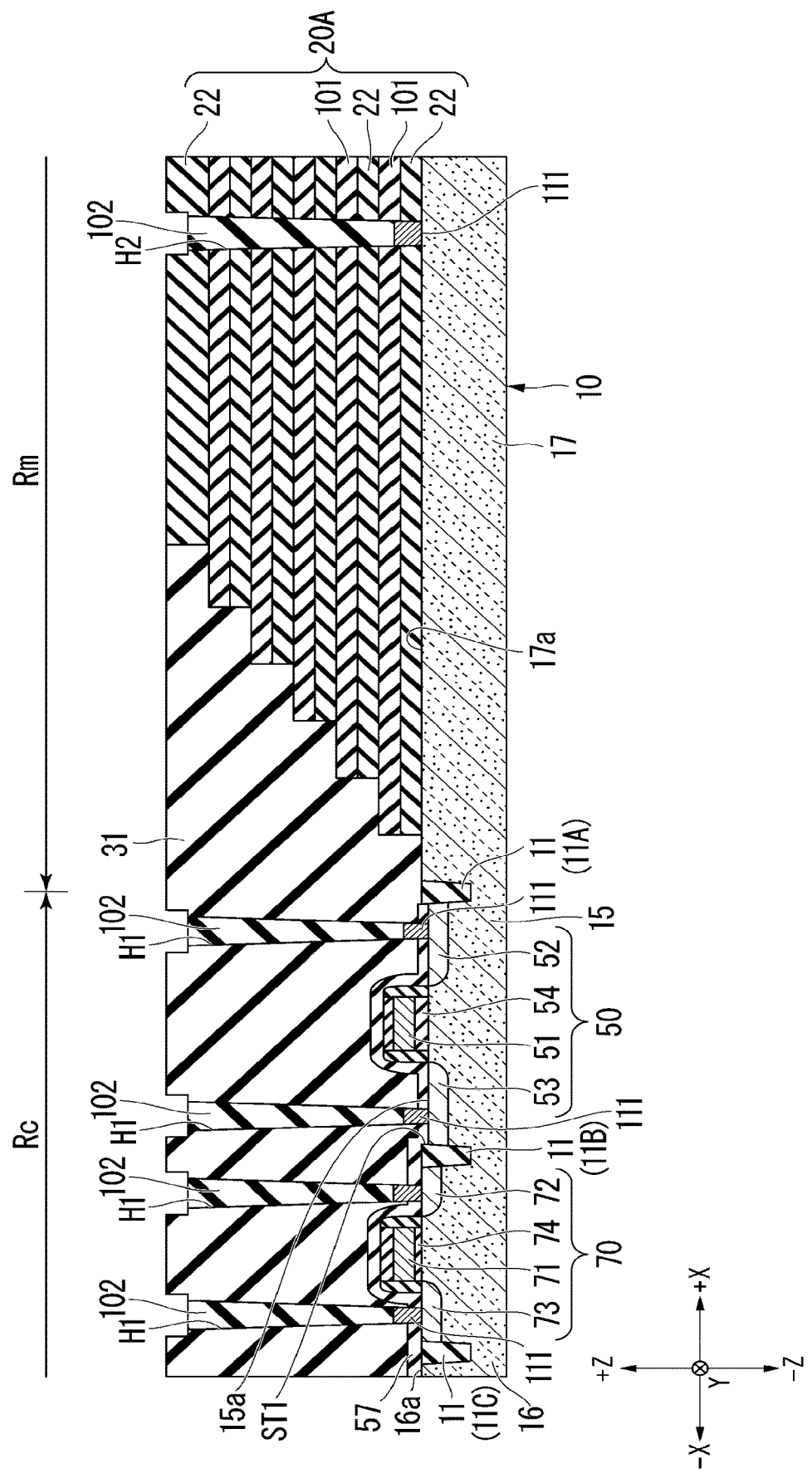
FIG. 8 is a cross-sectional view showing the method of manufacturing the integrated circuit device of the first embodiment.

Then, upper end portions of the first and second holes H1 and H2 are extended in the X direction and the Y direction by wet etching, as shown in FIG. 8. The sacrificial materials 102 are again buried in the upper end portions of the first and second holes H1 and H2 extended by the etching (see FIG. 9).

Figure 9:
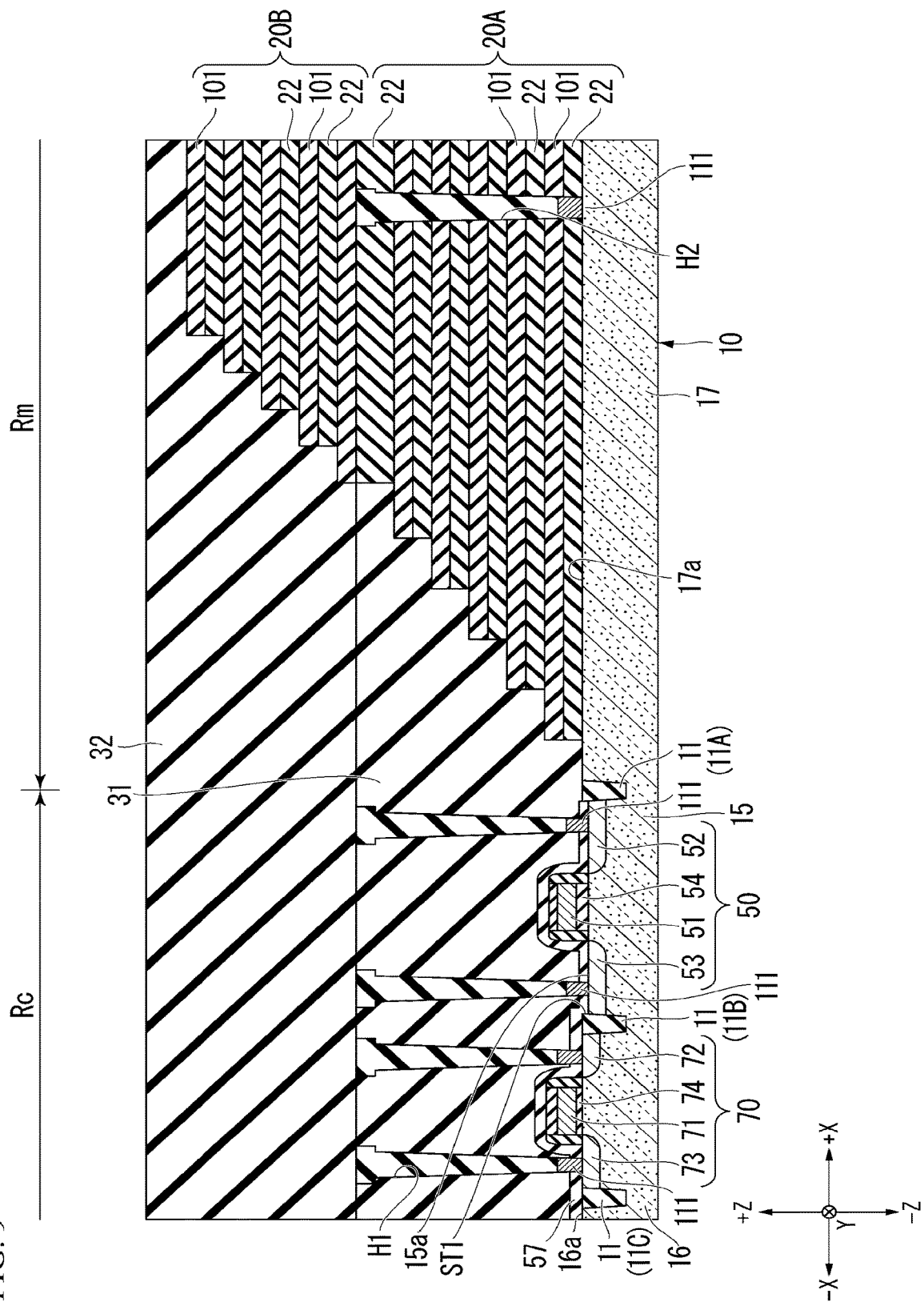
FIG. 9 is a cross-sectional view showing the method of manufacturing the integrated circuit device of the first embodiment.

Then, a second stack 20B is formed by the insulation films 22 and the replacement materials 101 being alternately stacked on the first stack 20A, as shown in FIG. 9. Then, a second insulation layer 32 is formed on the second stack 20B and the first insulation layer 31, for example, using the same method as the first insulation layer 31. The above-described insulation layer 30 is formed by the first insulation layer 31 and the second insulation layer 32.

Figure 10:
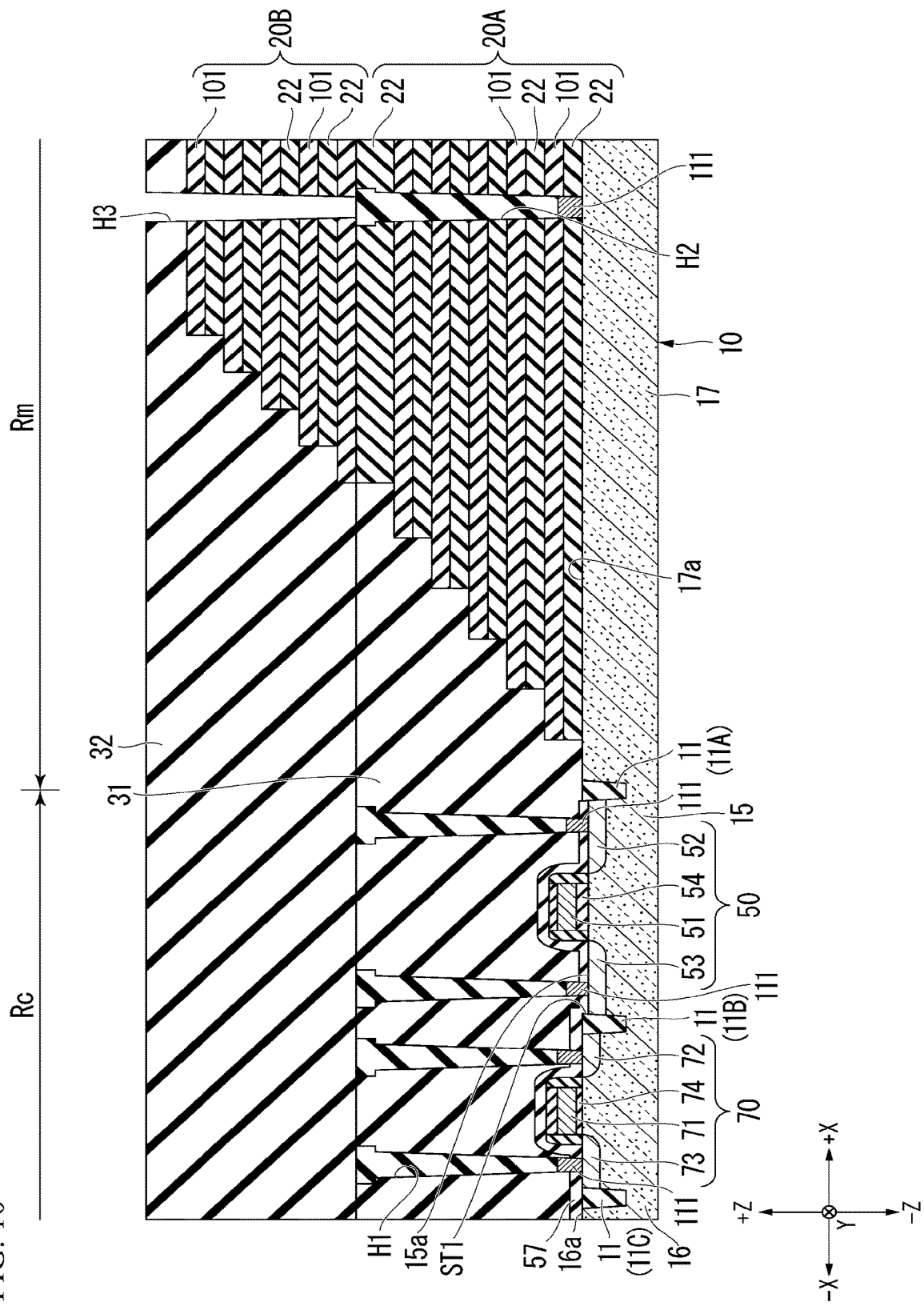
FIG. 10 is a cross-sectional view showing the method of manufacturing the integrated circuit device of the first embodiment.

Then, a third holes H3 are formed in the memory region Rm, as shown in FIG. 10. The third holes H3 are formed toward the sacrificial materials 102 buried in the second holes H2 and reaches an upper surface of the sacrificial material 102, respectively.

Figure 11:
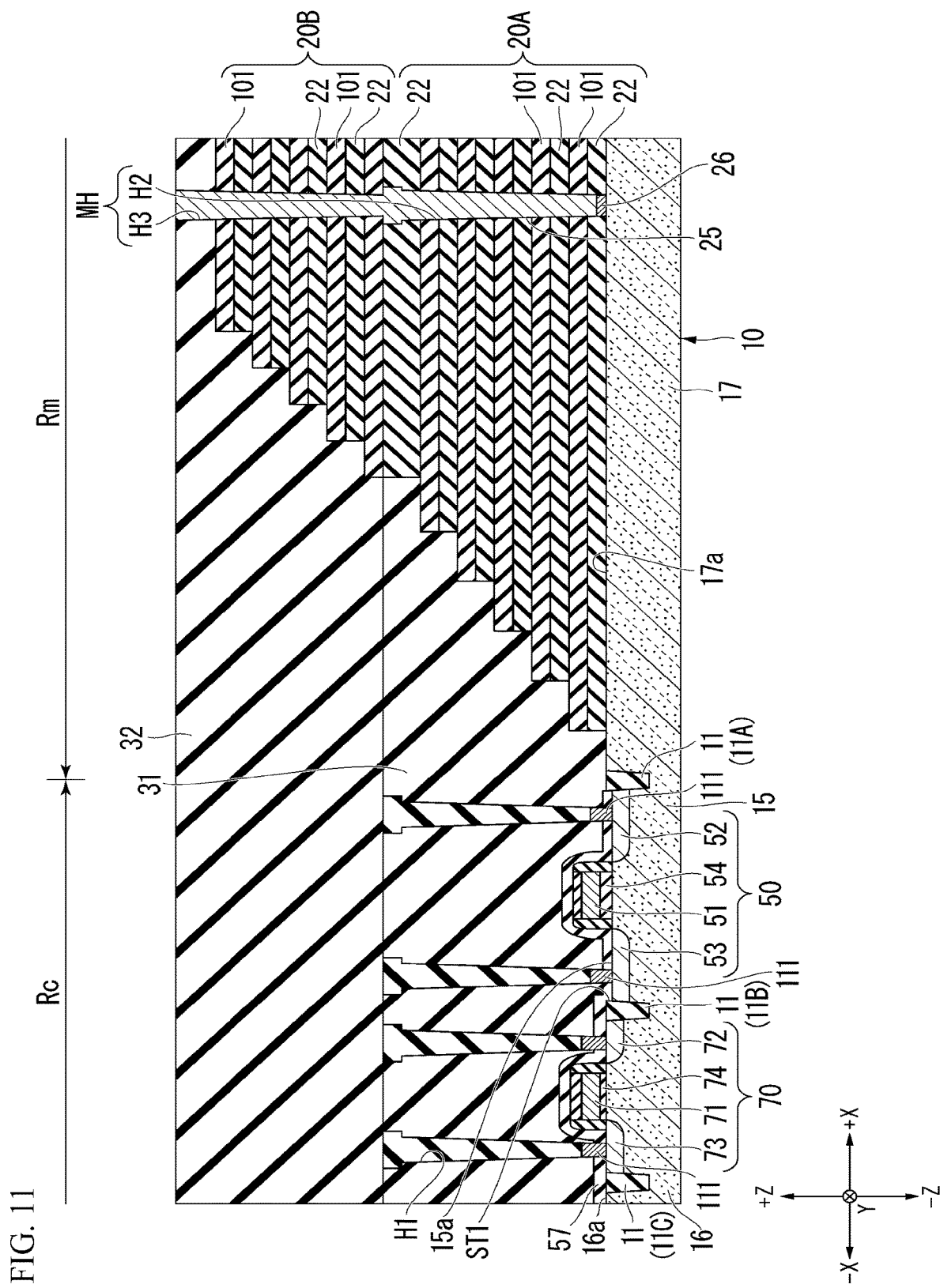
FIG. 11 is a cross-sectional view showing the method of manufacturing the integrated circuit device of the first embodiment.

Then, the sacrificial materials 102 are removed through the third holes H3, and the columns 25 are formed inside, as shown in FIG. 11. The sacrificial materials 102 are removed using, for example, wet etching. Accordingly, the second and third holes H2 and H3 become one continuous memory holes MH. When the sacrificial materials 102 are removed, the single crystal portions 111 disposed in the memory region Rm become the single crystal portions 26 by being partially removed. The columns 25 are formed in the memory holes MH.

Figure 12:
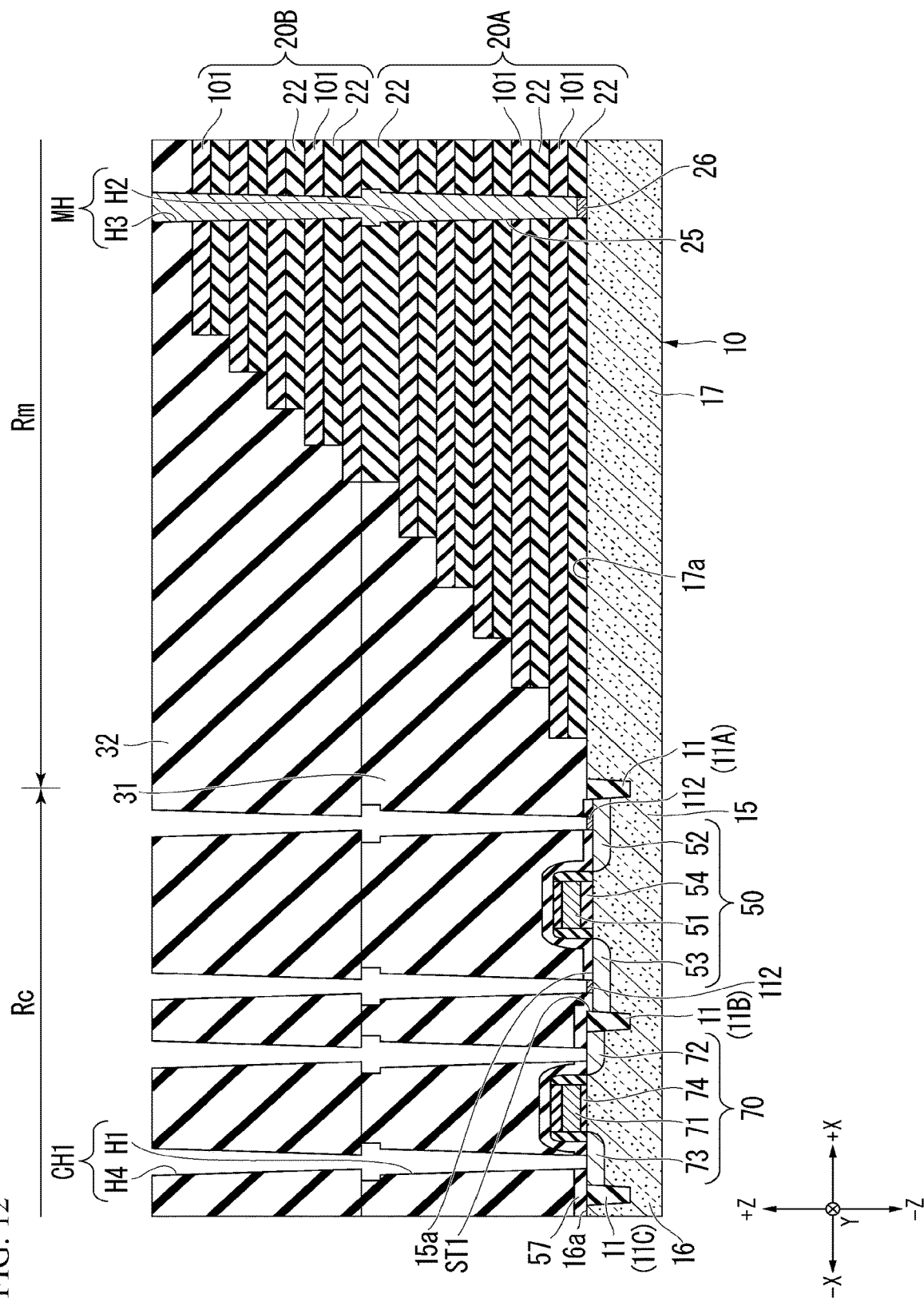
FIG. 12 is a cross-sectional view showing the method of manufacturing the integrated circuit device of the first embodiment.

Then, fourth holes H4 are formed in the circumferential circuit region Rc. Respective the fourth holes H4 are formed from an upper surface of the second insulation layer 32 toward the sacrificial materials 102 buried in the first holes H1, and reaches the upper surface of the sacrificial materials 102. The sacrificial materials 102 are removed through the fourth holes H4. The sacrificial materials 102 are removed using, for example, wet etching. Accordingly, the first and fourth holes H1 and H4 form one continuous contact holes CH1, as shown in FIG. 12. When the sacrificial materials 102 are removed, the single crystal portions 111 provided in the second transistor 70 are also removed. On the other hand, the single crystal portions 111 provided in the first transistor 50 become a single crystal portions 112 by being partially removed.

Figure 13:
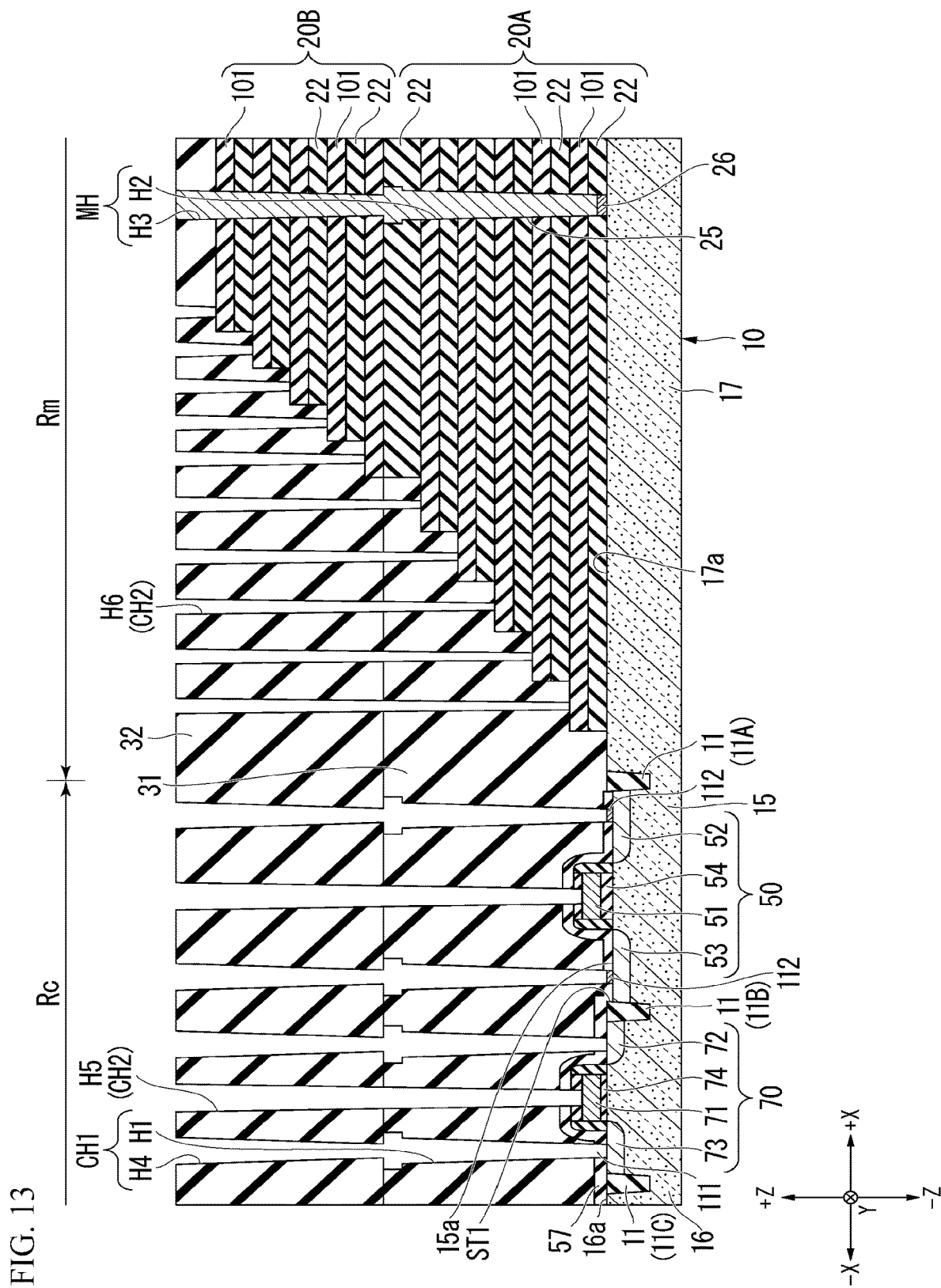
FIG. 13 is a cross-sectional view showing the method of manufacturing the integrated circuit device of the first embodiment.

Then, after the contact holes CH1 are backfilled with sacrificial materials, fifth and sixth holes H5 and H6 are formed. The backfilling sacrificial materials are removed after forming the fifth and sixth holes H5 and H6 as shown in FIG. 13. The fifth holes H5 are formed in the circumferential circuit region Rc. A sixth holes H6 are formed in the memory region Rm. The fifth holes H5 are formed from the upper surface of the second insulation layer 32 toward the first gate electrode 51 or the second gate electrode 71, penetrate the first insulation layer 31 and the protective film 57, and reaches an upper surface of the first gate electrode 51 or the second gate electrode 71. The sixth holes H6 extend from the upper surface of the second insulation layer 32 to an upper surface of the replacement materials 101 corresponding to the terrace 21a, respectively. The fifth and sixth holes H5 and H6 individually become contact holes CH2, respectively. The third to sixth holes H3, H4, H5, and H6 are processed using a lithography method and a reactive ion etching (RIE) method.

Ions with which the first source region 52 and the first drain region 53 have been doped are diffused into the single crystal portions 112 provided in the first transistor 50, respectively. Further, ion diffusion may be promoted by substrate heating being performed after the integrated circuit device 1 is manufactured. Accordingly, the single crystal portions 112 becomes the single crystal portions 61 and 62 including an n⁻ type semiconductor, respectively. When the respective impurities in the single crystal portions 61 and 62 are insufficient, ions may further be implanted into the single crystal portions 61 and 62 through the contact holes CH1, respectively. Further, ions may be implanted into single crystal portions 61 and 62 respectively through contacts 80B and 80C after the contacts 80B and 80C are formed, instead of or in addition to implanting the ions through contact hole CH1.

Figure 14:
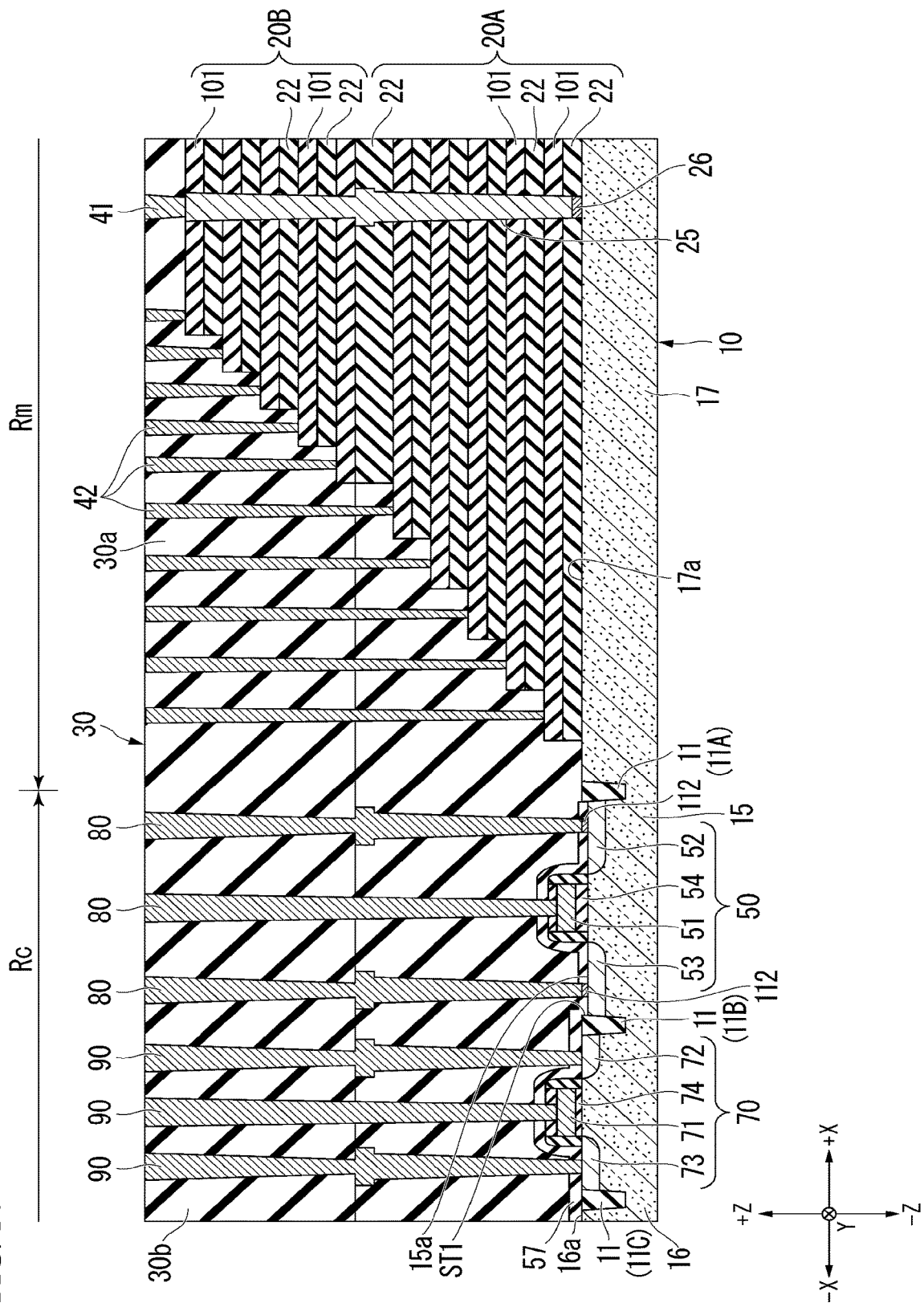
FIG. 14 is a cross-sectional view showing the method of manufacturing the integrated circuit device of the first embodiment.

Then, conductive members are buried in the contact holes CH1 and CH2, as shown in FIG. 14. Accordingly, the contacts 42, 80, and 90 are formed. Then, the replacement materials 101 are removed by wet etching. Then, spaces from which the replacement materials 101 have been removed are filled with conductive materials, and the conductive films 21 is formed.

Through the above process, the integrated circuit device 1 shown in FIG. 1 is manufactured. The manufacturing process shown herein is an example, and another process may be inserted between the respective processes.

With the integrated circuit device 1 according to the first embodiment described above, it is possible to achieve improvement of an operation speed of the integrated circuit device 1. Hereinafter, a reason therefor will be described.

Figure 15:
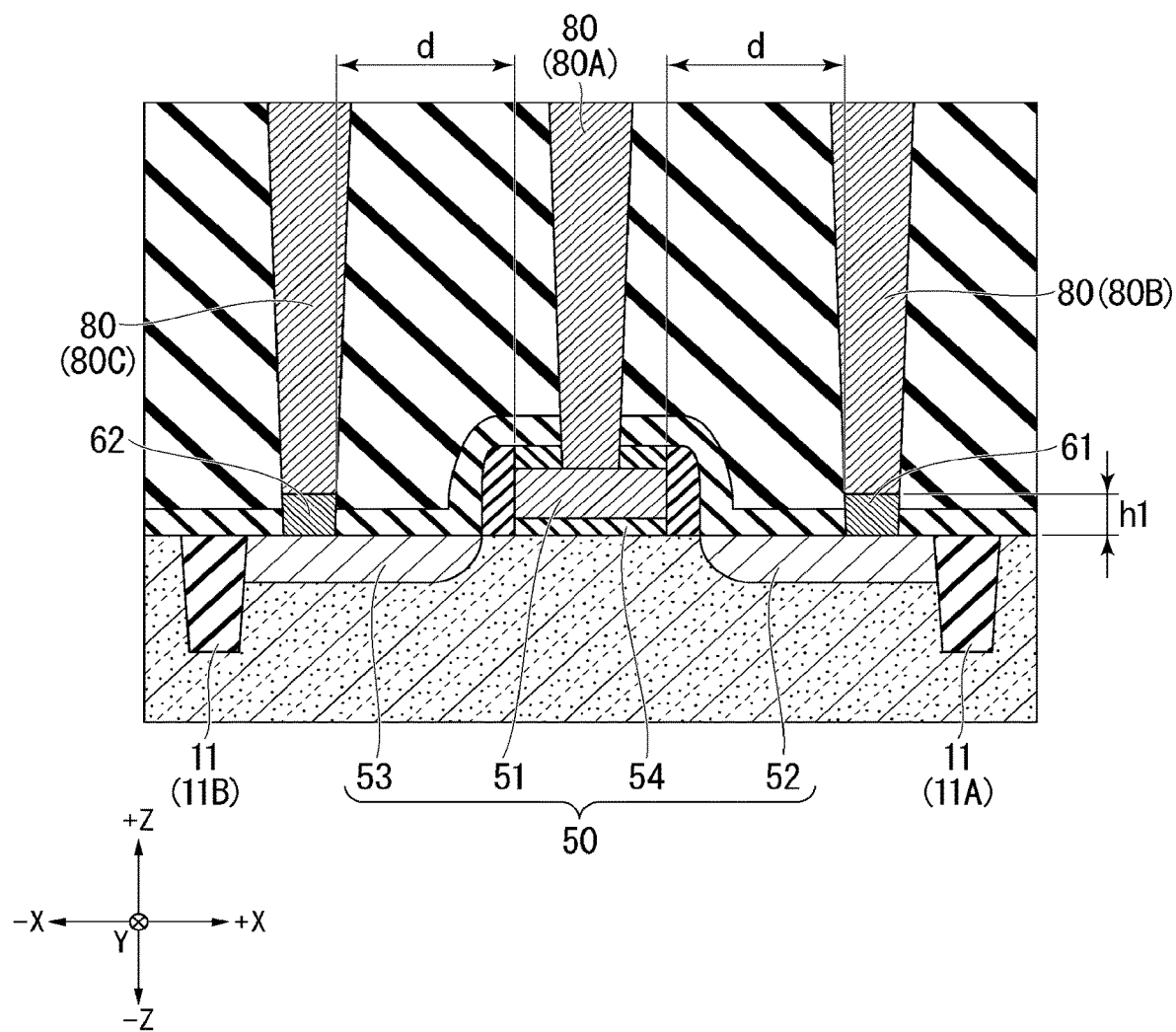
FIG. 15 is an enlarged cross-sectional view of characterizing portion of the integrated circuit device of the first embodiment.

FIG. 15 is a cross-sectional view showing the vicinity of the first transistor 50 of the integrated circuit device 1. A withstand voltage property of the first transistor 50 is affected by, for example, resistance of a current path between the second contact 80B and the first gate electrode 51. The withstand voltage property is a withstand voltage property when a voltage is applied to the first transistor 50, and is an index of a leakage likelihood of the first transistor 50.

When there is no single crystal portion 61, a shortest distance of a current path between the second contact 80B and the first gate electrode 51 is a width d between the second contact 80B and the first gate electrode 51 in the X direction. In the case of the distance between the second contact 80B and the first gate electrode 51 is short, it is necessary to increase the electric resistance value of the first source region in order to secure sufficient withstand voltage property. However, in this case, since the electric resistance value of the first source region 52 becomes high, it is difficult to achieve improvement of the operation speed of the integrated circuit device 1.

On the other hand, when there is the single crystal portion 61, the shortest distance of the current path between the second contact 80B and the first gate electrode 51 is a sum of the width d between the second contact 80B and the first gate electrode 51 in the X direction and the height h1 of the single crystal portion 61 in the Z direction. This will allow electrical distance between the second contact 80B and the first gate electrode 51 to be sufficient. As a result, even when an electrical resistance value of the first source region 52 is small, the withstand voltage is sufficient. Therefore, it is easy to achieve improvement of the operation speed of the integrated circuit device 1. From another viewpoint, the width d in the X direction between the second contact 80B and the first gate electrode 51 can be reduced by providing the single crystal portion 61. In this case, it is possible to achieve a small size of the integrated circuit device 1.

In the embodiment, the contacts 80B, 80C, 90B, and 90C are divided in two stages and formed. On the other hand, the contacts 80A and 90A are formed in one stage. Each of the contacts 80B, 80C, 90B, and 90C has a level at which the contacts 80B, 80C, 90B, and 90C have respective maximum widths, and the level is different from another level at which the contacts 80A and 90A have respective maximum widths.

Portions of the contacts 80 and 90 can tilt in the X or Y direction, where the contacts 80B, 80C, 90B and 90C are still distant from the contacts 80A and 90A. Therefore, it is possible to achieve a small size of the integrated circuit device 1 while reducing a likelihood of a short-circuit between the contacts 80B, 80C, 90B, and 90C and the contacts 80A and 90A.

First Modification Example

Next, a first modification example of the embodiment will be described.

Figure 16:
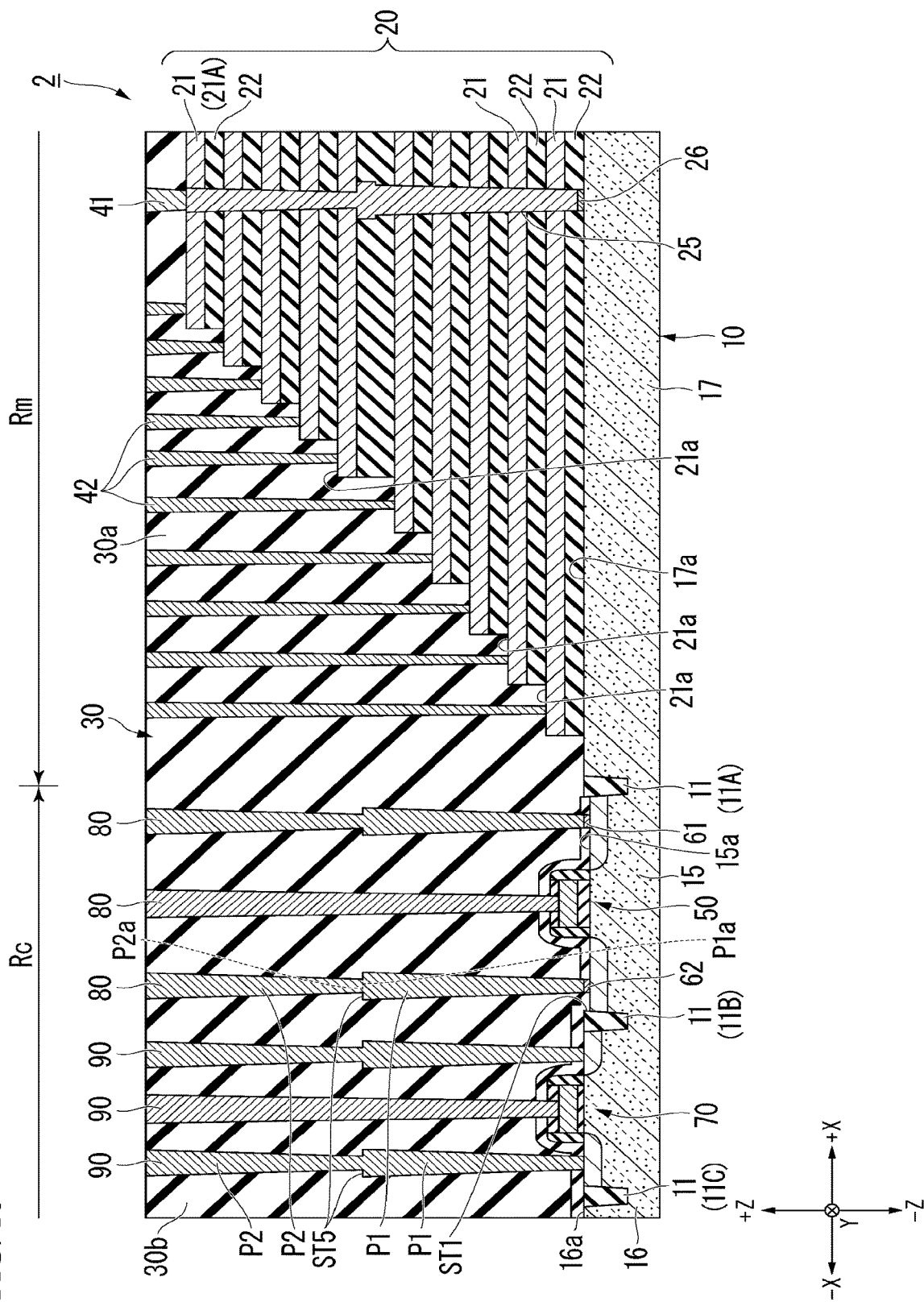
FIG. 16 is a cross-sectional view showing an integrated circuit device of a first modification example of the first embodiment.

FIG. 16 is a schematic cross-sectional view of an integrated circuit device 2 according to the first modification example of the first embodiment. The integrated circuit device 2 according to the first modification example differs from the integrated circuit device 1 shown in FIG. 1 in structures of the contacts 80B, 80C, 90B, and 90C and the column 25. A configuration other than that to be described below is the same as that of the integrated circuit device 1 according to the first embodiment.

For example, the contacts 80B, 80C, 90B, and 90C of the integrated circuit device 2 have a two-step shape without the junction portion JT. That is, the contacts 80B, 80C, 90B, and 90C, the first columnar portion P1 and the second columnar portion P2 are directly connected, respectively.

The first columnar portion P1 has an upper end P1a that is in contact with the second columnar portion P2. The second columnar portion P2 has a lower end P2a that is in contact with the first columnar portion P1. Respective widths of the upper end P1a of the first columnar portion P1 in the X direction and the Y direction are greater than widths of the lower end P2a of the second columnar portion P2 in the X direction and the Y direction, respectively. Therefore, there is a step ST5 at a boundary between the first columnar portion P1 and the second columnar portion P2. There are the step ST5 in a range of a first distance L1 from the surface 15a of the first substrate portion 15 or the surface 16a of the second substrate portion 16 in the Z direction. Respective the contacts 80B, 80C, 90B, and 90C change discontinuously at the step ST5 in widths in the X direction and the Y direction.

On the other hand, the contacts 80A and 90A continuously change in respective widths in the X and Y directions with in a range of the first distance L1 from the surface 15a of the first substrate portion 15 or the surface 16a of the second substrate portion 16, respectively.

With such a configuration, it is possible to achieve an improved operation speed and a small size, as in the first embodiment.

Second Modification Example

Next, a second modification example of the embodiment will be described.

Figure 17:
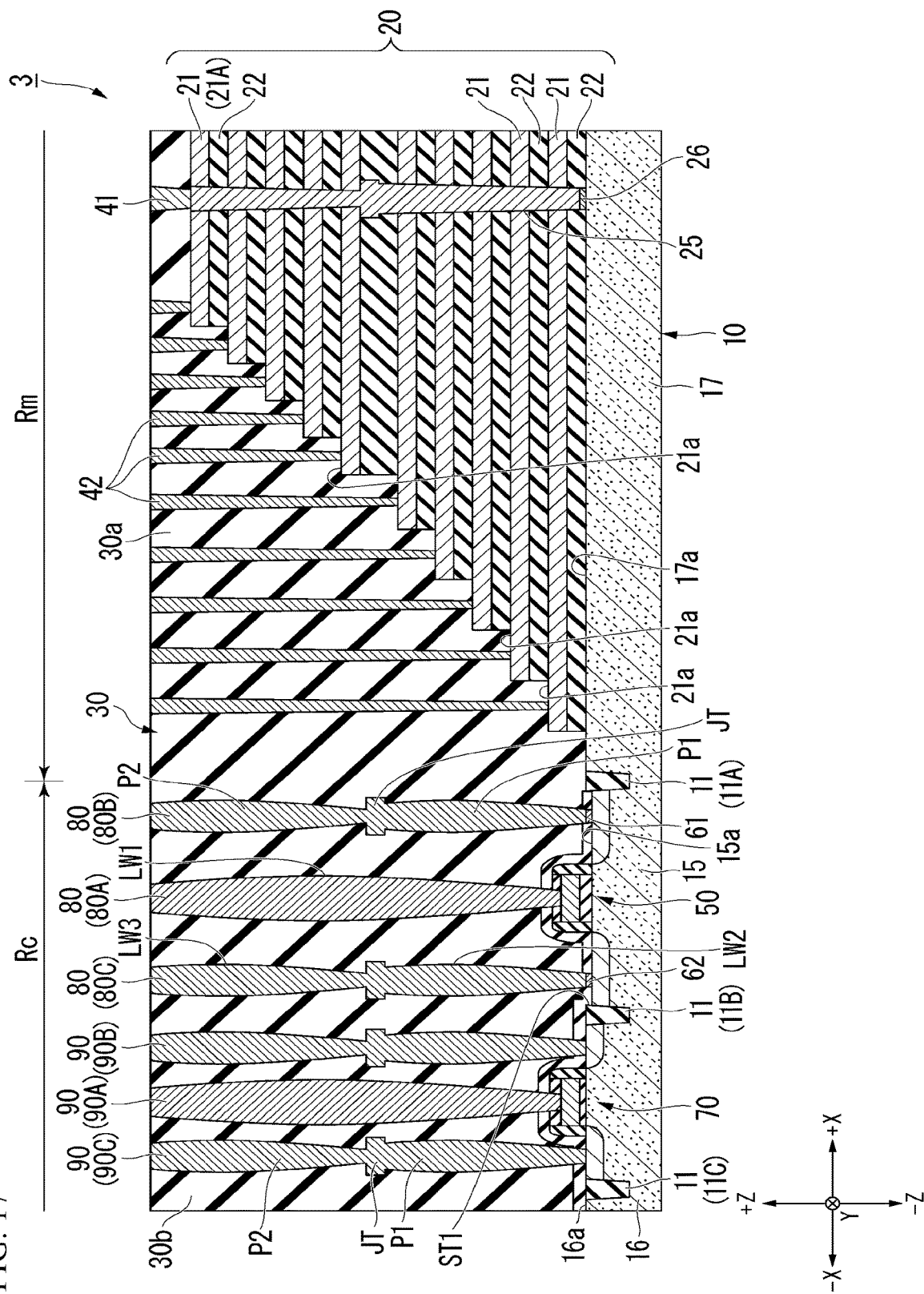
FIG. 17 is a cross-sectional view showing an integrated circuit device of a second modification example of the first embodiment.

FIG. 17 is a schematic cross-sectional view of an integrated circuit device 3 according to a second modification example of the first embodiment. The integrated circuit device 3 according to the second modification example of the first embodiment is different from the integrated circuit device 1 shown in FIG. 1 in a structure of the contacts 80 and 90. A configuration other than that to be described below is the same as that of the first embodiment.

In the second modification example, a contact 80A has a wide portion LW1 in which widths in the X direction and the Y direction are largest in the contact 80A, at a portion different from an upper end and a lower end of the contact 80A. Similarly, a contact 90A has a wide portion LW1 in which widths in the X direction and the Y direction are largest in the contact 90A, at a portion different from an upper end and a lower end of the contact 90A.

Respective first columnar portions P1 of contacts 80B, 80C, 90B, and 90C have wide portions LW2 in which widths in the X direction and the Y direction are largest in the first columnar portions P1, at a portion different from an upper end and a lower end of the first columnar portions P1, respectively.

Respective second columnar portions P2 of contacts 80B, 80C, 90B, and 90C have wide portions LW3 in which widths in the X direction and the Y direction are largest in the second columnar portions P2, at a portion different from an upper end and a lower end of the second columnar portions P2, respectively.

With such a configuration, it is possible to achieve an improved operation speed and a small size, as in the first embodiment. In the embodiment, since the contacts 80A and 90A are formed in a single-step configuration, and the contacts 80B, 80C, 90B, and 90C are formed in a two-step configuration, the positions in the Z direction of the wide portions LW2 and LW3 and the position in the Z direction of the wide portion LW1 are greatly different. Therefore, it is easy to secure a large distance between the contacts 80B, 80C, 90B, and 90C and the contacts 80A and 90A.

Second Embodiment

Next, an integrated circuit device 4 according to a second embodiment will be described. The integrated circuit device 4 of the second embodiment is different from the first embodiment in that a portion of first and second single crystal portions 61 and 62 are an $N^+$ type semiconductor. It should be noted that a configuration other than that to be described below is the same as that of the first embodiment.

Figure 18:
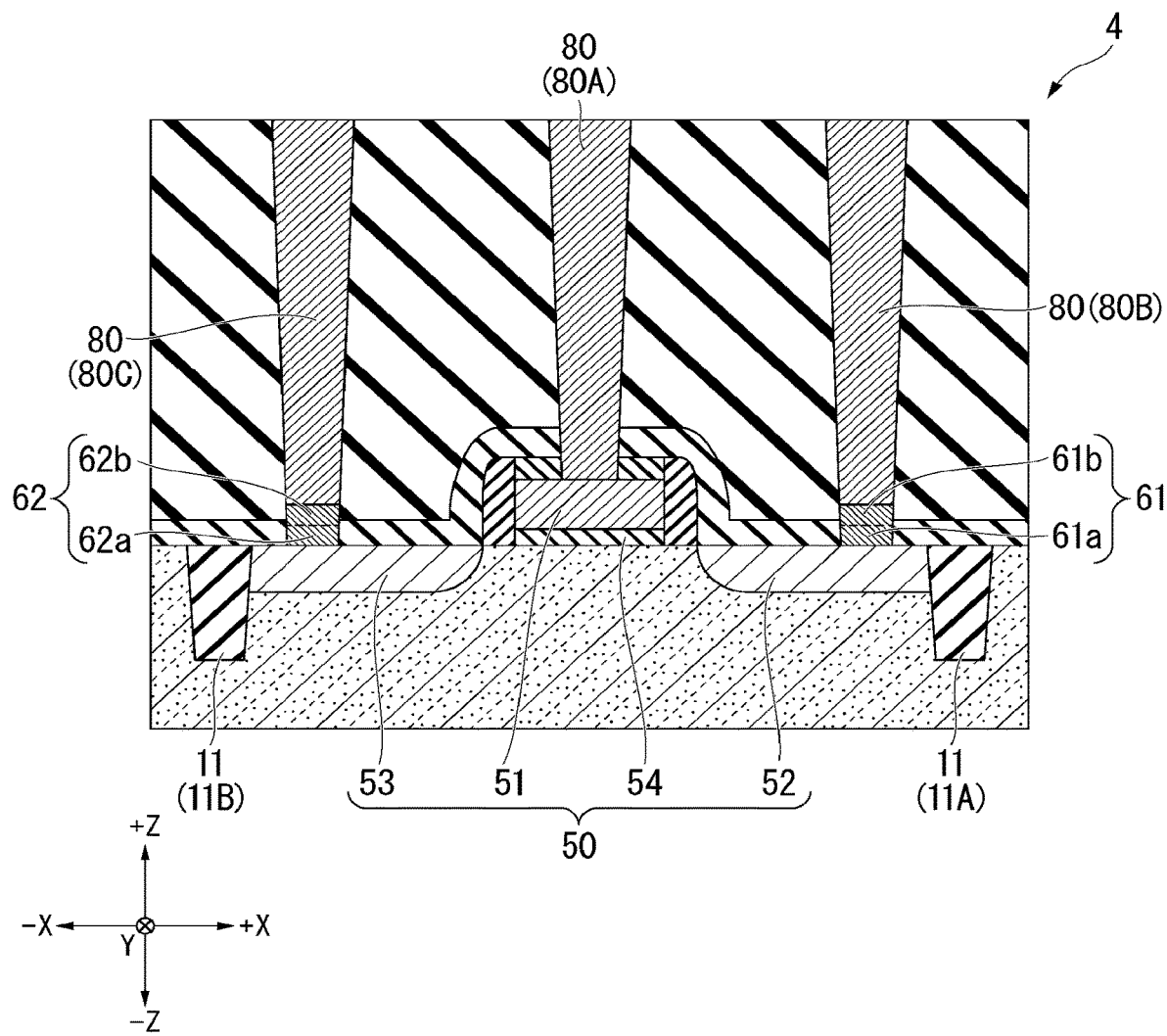
FIG. 18 is a cross-sectional view showing a first transistor of a second embodiment.

FIG. 18 is a cross-sectional view showing the integrated circuit device 4 of the second embodiment. In the second embodiment, the first single crystal portion 61 includes a first portion 61a and a second portion 61b. The first portion 61a is an $N^-$ type semiconductor and is in contact with a first source region 52. The first portion 61a is formed, for example, by impurities contained in the first source region 52 being diffused. On the other hand, the second portion 61b is an $N^+$ type semiconductor, and is disposed between the first portion 61a and a contact 80B in the Z direction. The second portion 61b is formed by ions being implanted through the contact hole CH1 or the contact 80B.

Similarly, the second single crystal portion 62 includes a first portion 62a and a second portion 62b. The first portion 62a is an $N^-$ type semiconductor and is in contact with a first drain region 53. The first portion 62a is formed, for example, by impurities contained in the second drain region 73 being diffused. On the other hand, the second portion 62b is an $N+$ type semiconductor, and is disposed between the second portion 62a and a contact 80C in the Z direction. The second portion 62b is formed by ions being implanted through the contact hole CH1 or the contact 80C.

With such a configuration, it is possible to achieve an improved operation speed and a small size, as in the first embodiment. In the embodiment, since the first and second single crystal portions 61 and 62 have an $N^+$ semiconductor in a portion of contact with the contact 80, it is possible to improve electrical connectivity between the first and second single crystal portions 61 and 62 and the contact 80.

Third Embodiment

Next, an integrated circuit device 5 according to a third embodiment will be described. The integrated circuit device 5 of the third embodiment is different from that of the first embodiment in that configurations of the insulation layer 30 and the contacts 80 and 90 are different. A configuration other than that to be described below is the same as that of the first embodiment.

Figure 19:
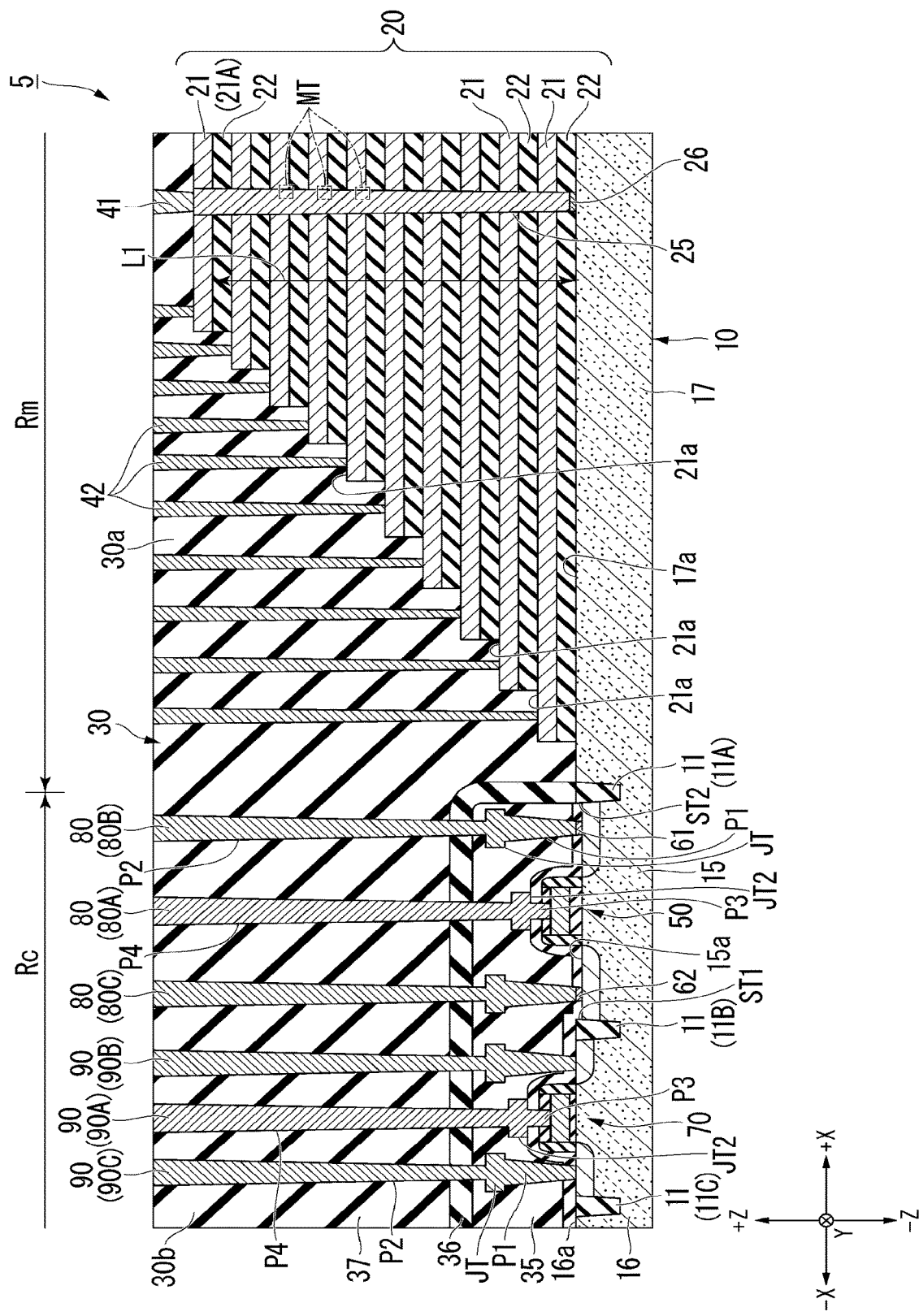
FIG. 19 is a cross-sectional view showing an integrated circuit device according to a third embodiment.

FIG. 19 is a cross-sectional view showing the integrated circuit device 5 of the third embodiment. In the third embodiment, a second portion 30b of the insulation layer 30 includes a first layer 35, a second layer 36, and a third layer 37. The first layer 35, the second layer 36, and the third layer 37 are disposed in this order in the +Z direction. The first layer 35 covers a first transistor 50 and a second transistor 70. The second layer 36 covers the first layer 35. The third layer 37 covers the second layer 36 and a stack 20. The first layer 35 and the third layer 37 are, for example, silicon oxide. The second layer 36 is, for example, silicon nitride. The second layer 36 prevents hydrogen diffusion from the stack 20 to the first transistor 50 and the second transistor 70.

Respective contacts 80B, 80C, 90B, and 90C includes a first columnar portion P1, a junction portion JT, and a second columnar portion P2. In the third embodiment, the first columnar portion P1 and the junction portion JT are disposed in the first layer 35. The second columnar portion P2 penetrates the third layer 37, the second layer 36 and at least a portion of the first layer 35. Respective single crystal portions 61 and 62 are provided between a lower ends of the contacts 80B, 80C, 90B, and 90C and a semiconductor substrate 10. In the third embodiment, the single crystal portions 61 and 62 may not be provided.

In the third embodiment, each of contacts 80A and 90A includes a third columnar portion P3, a second junction portion JT2, and a fourth columnar portion P4. The third columnar portion P3, the second junction portion JT2, and the fourth columnar portion P4 are examples of a "first portion", a "second portion", and a "third portion" in the contact, respectively. A third column portion P3, a second junction portion JT2, and a fourth column portion P4 are disposed in this order in the +Z direction. A shape of respective the third column portion P3 and the fourth column portion P4 is a columnar shape, a truncated cone shape, an inverted truncated cone shape, or a barrel shape. The third columnar portion P3 and the second junction portion JT2 are disposed in the first layer 35. The fourth columnar portion P4 penetrates the third layer 37, the second layer 36 and at least a portion of the first layer 35. The second junction portion JT2 has a different position in the Z direction from the junction portion JT.

Figure 20:
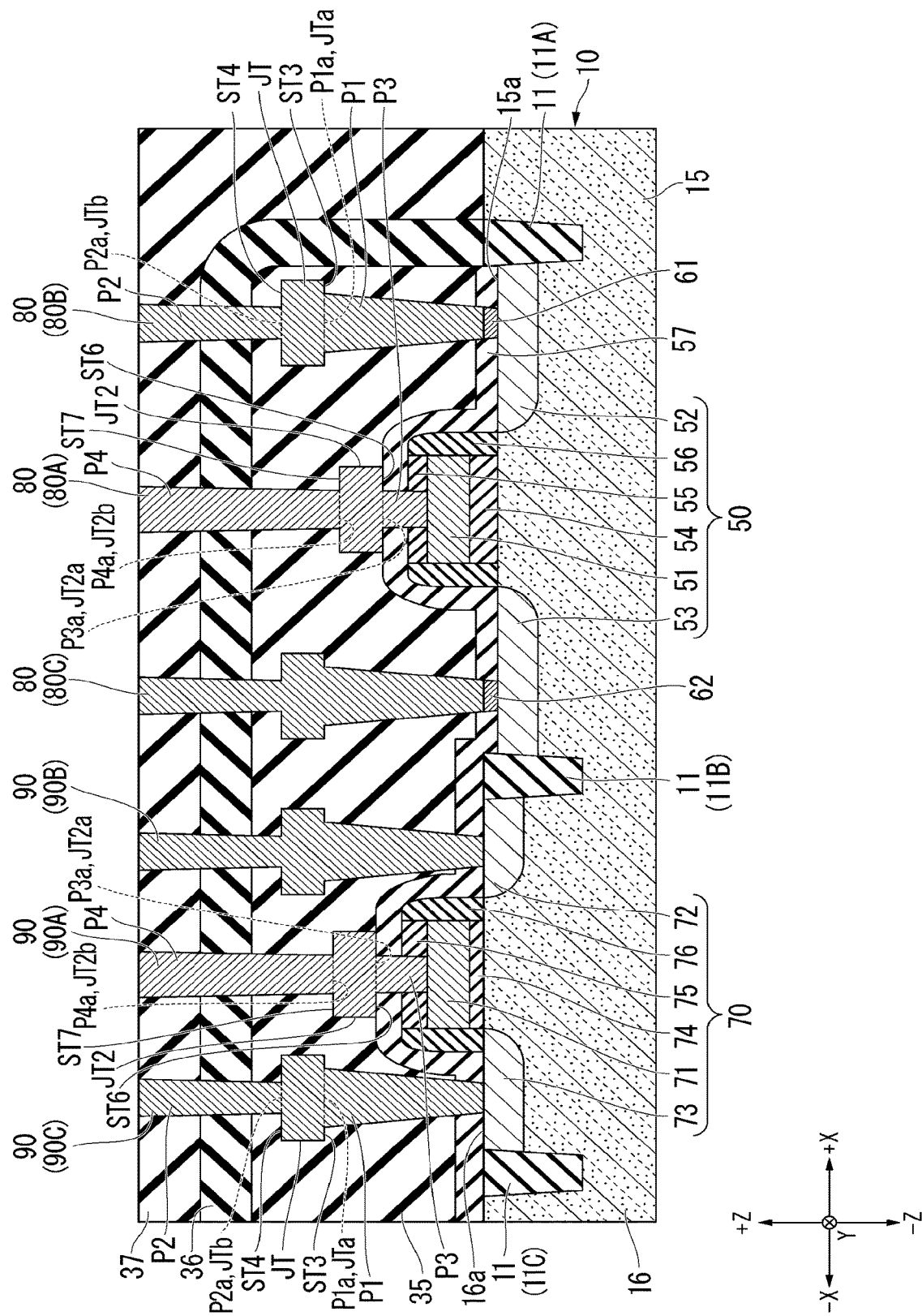
FIG. 20 is a cross-sectional view of the vicinity of a first transistor and a second transistor of the integrated circuit device according to the third embodiment.

FIG. 20 is an enlarged cross-sectional view of the vicinity of the first transistor 50 and the second transistor 70 of the integrated circuit device 5 according to the third embodiment. The first columnar portion P1 has an upper end P1a that is in contact with the junction portion JT. The junction portion JT has a lower end JTa that is in contact with the first columnar portion P1 and an upper end JTb that is in contact with the second columnar portion P2. The second column portion P2 has the lower end P2a that is in contact with the junction portion JT. There is a step ST3 at a boundary between the first columnar portion P1 and the junction portion JT. There is a step ST4 at a boundary between the junction portion JT and the second columnar portion P2.

The third columnar portion P3 has an upper end P3a that is in contact with the second junction portion JT2. The second junction portion JT2 has a lower end JT2a that is in contact with the third columnar portion P3 and an upper end JT2b that is in contact with the fourth columnar portion P4. The fourth column portion P2 has a lower end P4a that is in contact with the second junction portion JT. The upper end JT2b of the second junction portion JT2 is an example of a "first end". The lower end P4a of the fourth columnar portion P4 is an example of a "second end". There is a step ST6 at a boundary between the third columnar portion P3 and the second junction portion JT2. There is a step ST7 at a boundary between the second junction portion JT2 and the fourth columnar portion P4.

The steps ST3, ST4, ST6, and ST7 are disposed in the range from the surface 15a or 16a of the first substrate portion 15 or the second substrate portion 16 to the second layer 36 in the Z direction. Respective the contacts 80 and 90 change discontinuously in widths in the X and Y directions at the steps ST3, ST4, ST6 and ST7, respectively.

Figure 21:
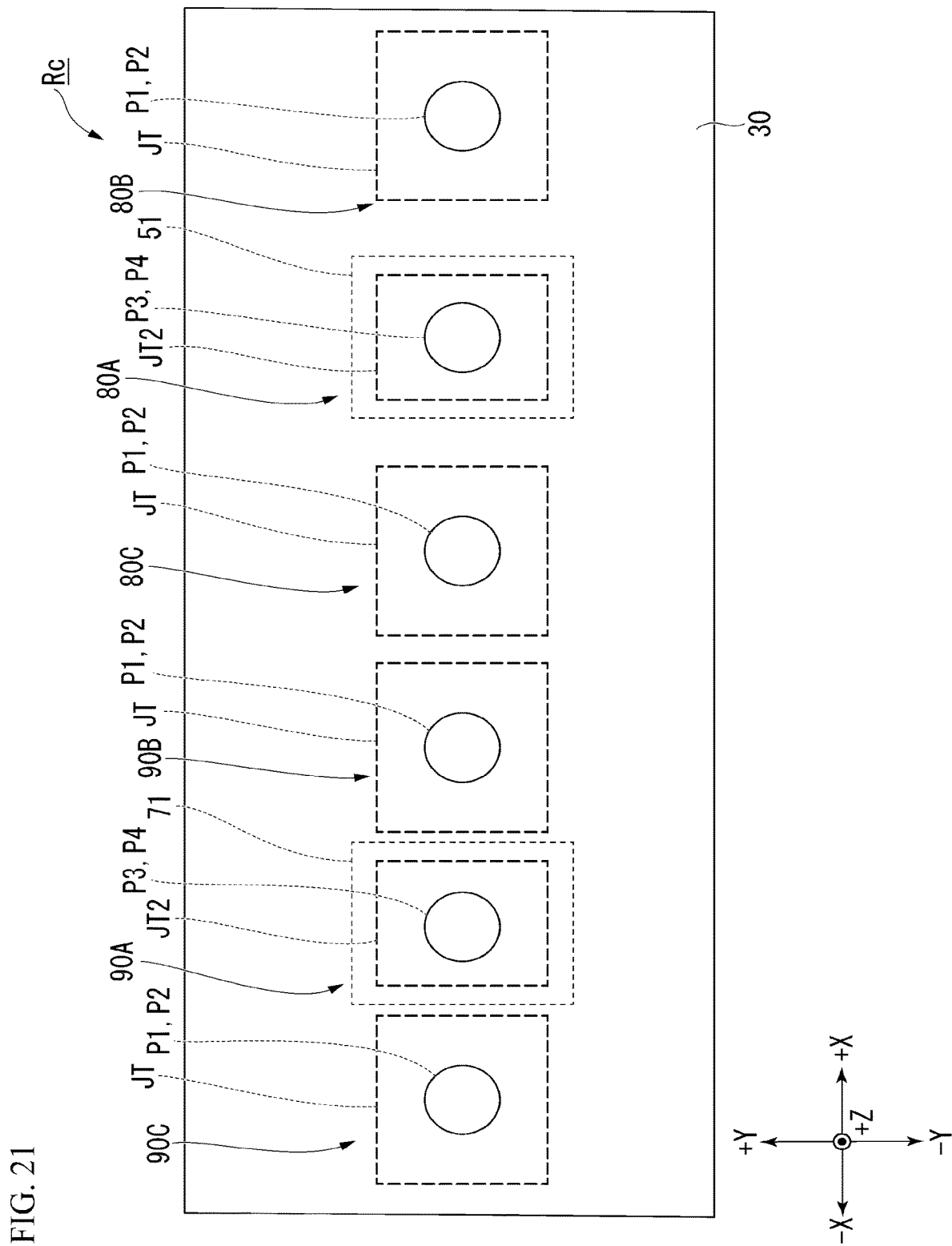
FIG. 21 is a plan view of a circumferential circuit region according to the third embodiment.

FIG. 21 is a plan view of a circumferential circuit region Rc according to the third embodiment. Widths of the junction portion JT in the X direction and the Y direction are greater than widths of the first columnar portion P1 and the second columnar portion P2 in the X direction and the Y direction, respectively. Specifically, widths of the lower end JTa of the junction portion JT in the X direction and the Y direction are greater than widths of the upper end P1a of the first columnar portion P1 in the X direction and the Y direction, respectively. Widths of the lower end P2a of the second columnar portion P2 in the X direction and the Y direction are smaller than the widths of the upper end JTb of the junction portion JT in the X direction and the Y direction, respectively.

Widths of the second junction portion JT2 in the X direction and the Y direction are greater than widths of the third columnar portion P3 and the fourth columnar portion P4 in the X direction and the Y direction, respectively, and are smaller than the width of the first gate electrode 51 or the second gate electrode 71 Specifically, widths of the lower end JT2a of the second junction portion JT2 in the X direction and the Y direction are greater than widths of the upper end P3a of the third columnar portion P3 in the X direction and the Y direction, respectively. Widths of the lower end P4a of the fourth columnar portion P4 in the X direction and the Y direction are smaller than widths of the upper end JT2b of the second junction portion JT2 in the X direction and the Y direction, respectively.

Next, a method of manufacturing the integrated circuit device 5 of the third embodiment will be described. FIGS. 22 to 27 are cross-sectional views showing an example of a method of manufacturing the integrated circuit device 5.

First, a plurality of element isolation insulation films 11, a first transistor 50, a second transistor 70, and a protective film 57 are formed on the semiconductor substrate 10 using, for example, a known method, as shown in FIG. 4.

Figure 22:
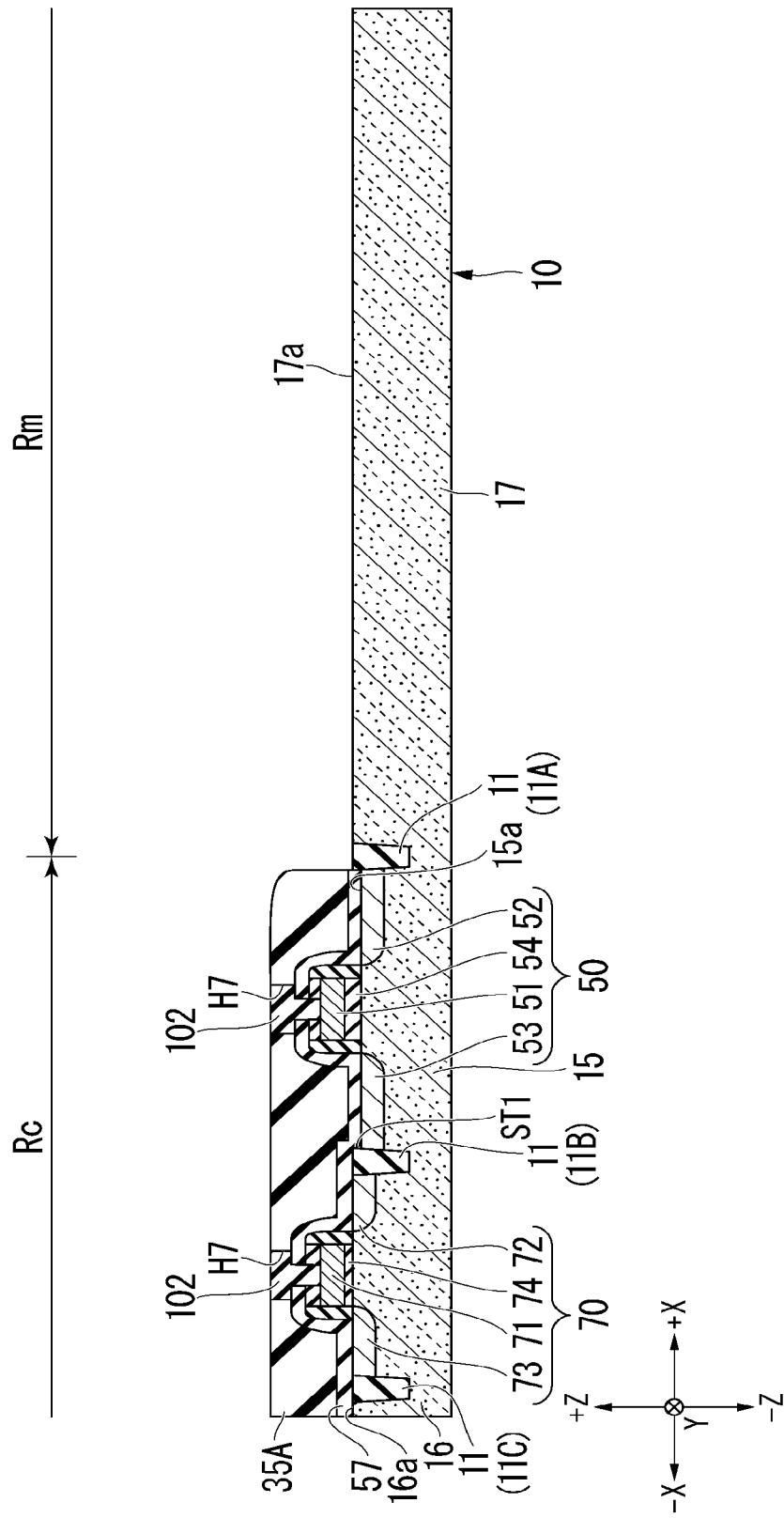
FIG. 22 is a cross-sectional view showing a method of manufacturing the integrated circuit device of the third embodiment.

Next, a first portion 35A of the first layer 35 is formed on the first transistor 50 and the second transistor 70, as shown in FIG. 22. Then, holes H7 are formed in the first portion 35, the insulation film 55, and the protective film 57, and the inside thereof is buried with the sacrificial materials 102. The first portion 35A is formed, for example, using a chemical vapor deposition method.

Figure 23:
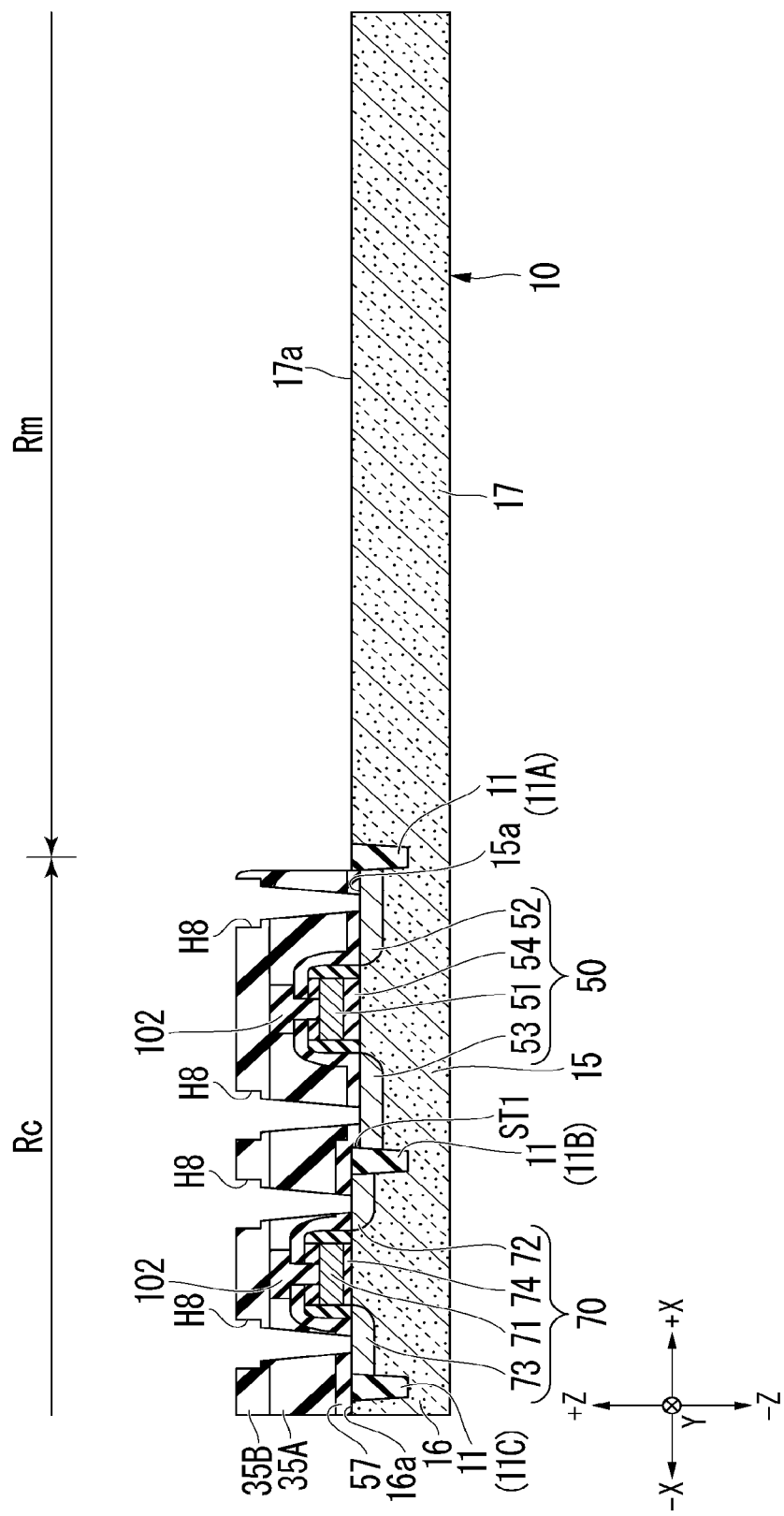
FIG. 23 is a cross-sectional view showing the method of manufacturing the integrated circuit device of the third embodiment.

Then, a second portion 35B of the first layer 35 is formed on the first portion 35A and the sacrificial materials 102, as shown in FIG. 23. The second portion 35B is formed, for example, using the same method as the first portion 35A.

Holes H8 are formed in the first portion 35A and the second portion 35B. The holes H8 have a portion extended in the X direction and the Y direction. The extension of the holes H8 in the X direction and the Y direction are performed by wet etching after the sacrificial materials are etched back, as in the method shown in FIGS. 7 and 8.

Figure 24:
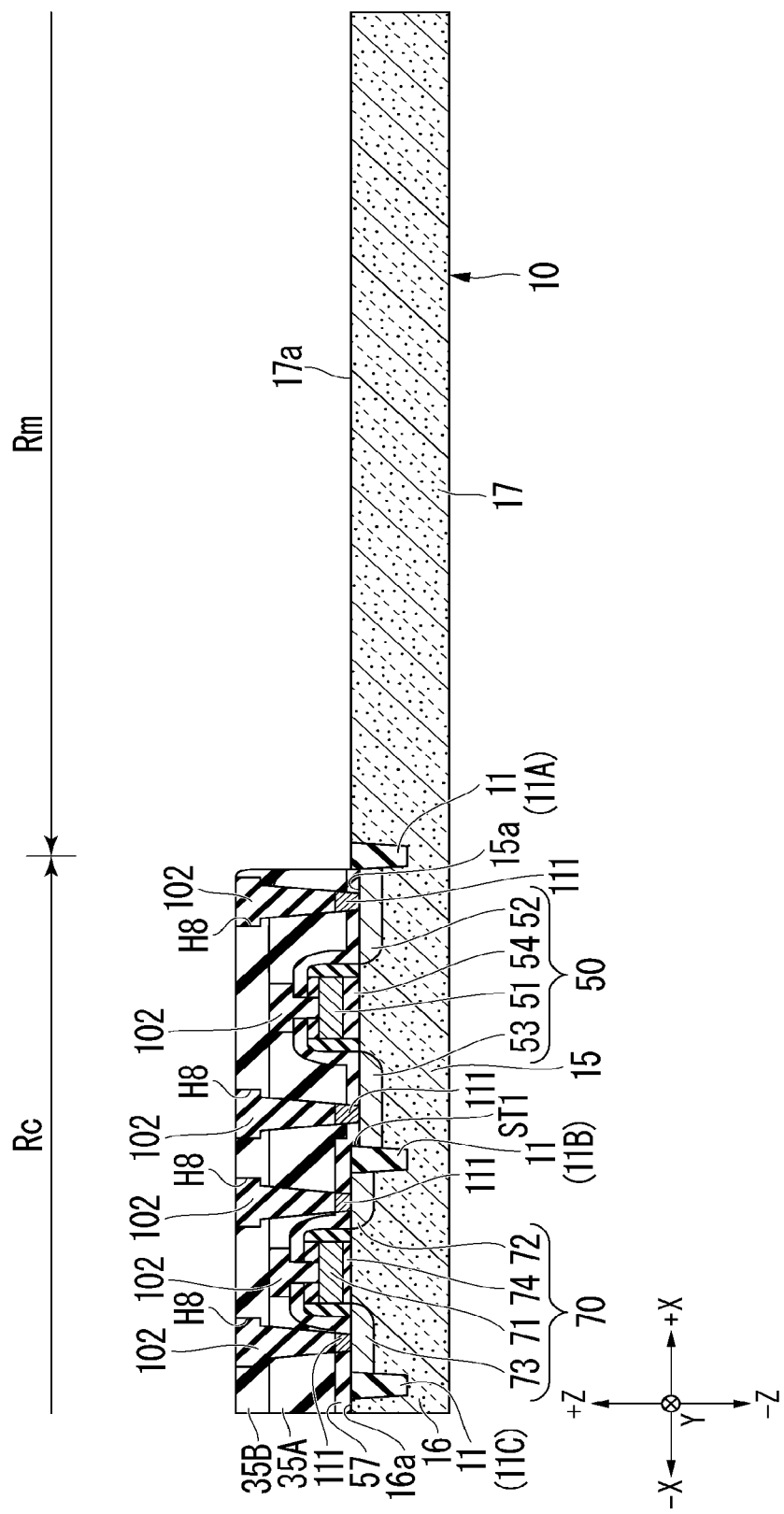
FIG. 24 is a cross-sectional view showing the method of manufacturing the integrated circuit device of the third embodiment.

Then, silicon single crystals carry out epitaxial growth in the holes H8. Accordingly, the single crystal portions 111 are formed at a lower end portion of respective the holes H8. As shown in FIG. 24, after the single crystal portions 111 are formed, the holes H8 are filled with the sacrificial materials 102. When the integrated circuit device 5 does not includes the single crystal portions 61 and 62, the process can be omitted.

Figure 25:
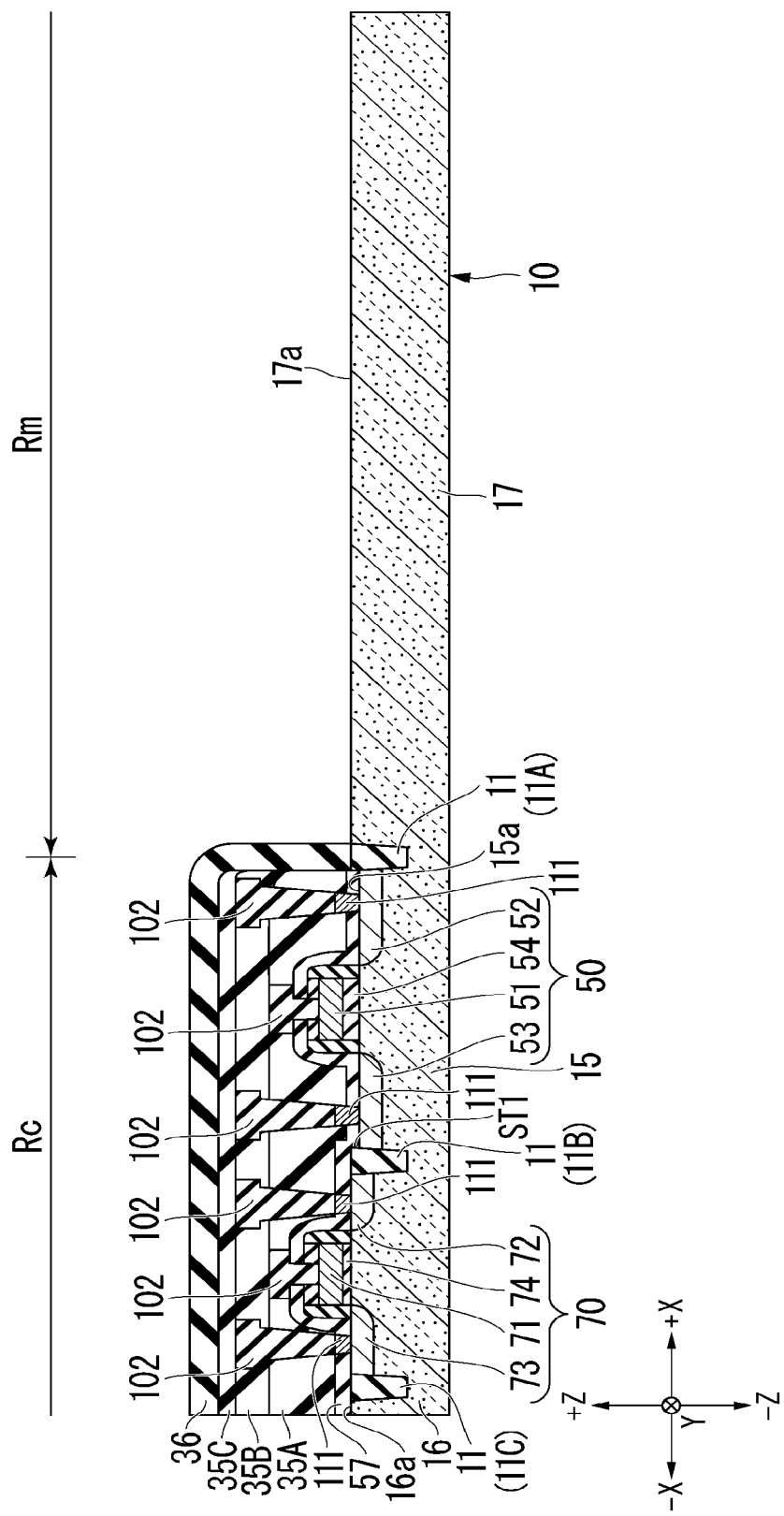
FIG. 25 is a cross-sectional view showing the method of manufacturing the integrated circuit device of the third embodiment.

Then, a third portion 35C of the first layer 35 and the second layer 36 are formed on the second portion 35B and the sacrificial materials 102, as shown in FIG. 25. The third portion 35C and the second layer 36 are formed, for example, using the same method as the first portion 35A. The first layer 35 is formed of the first portion 35A, the second portion 35B, and the third portion 35C.

Figure 26:
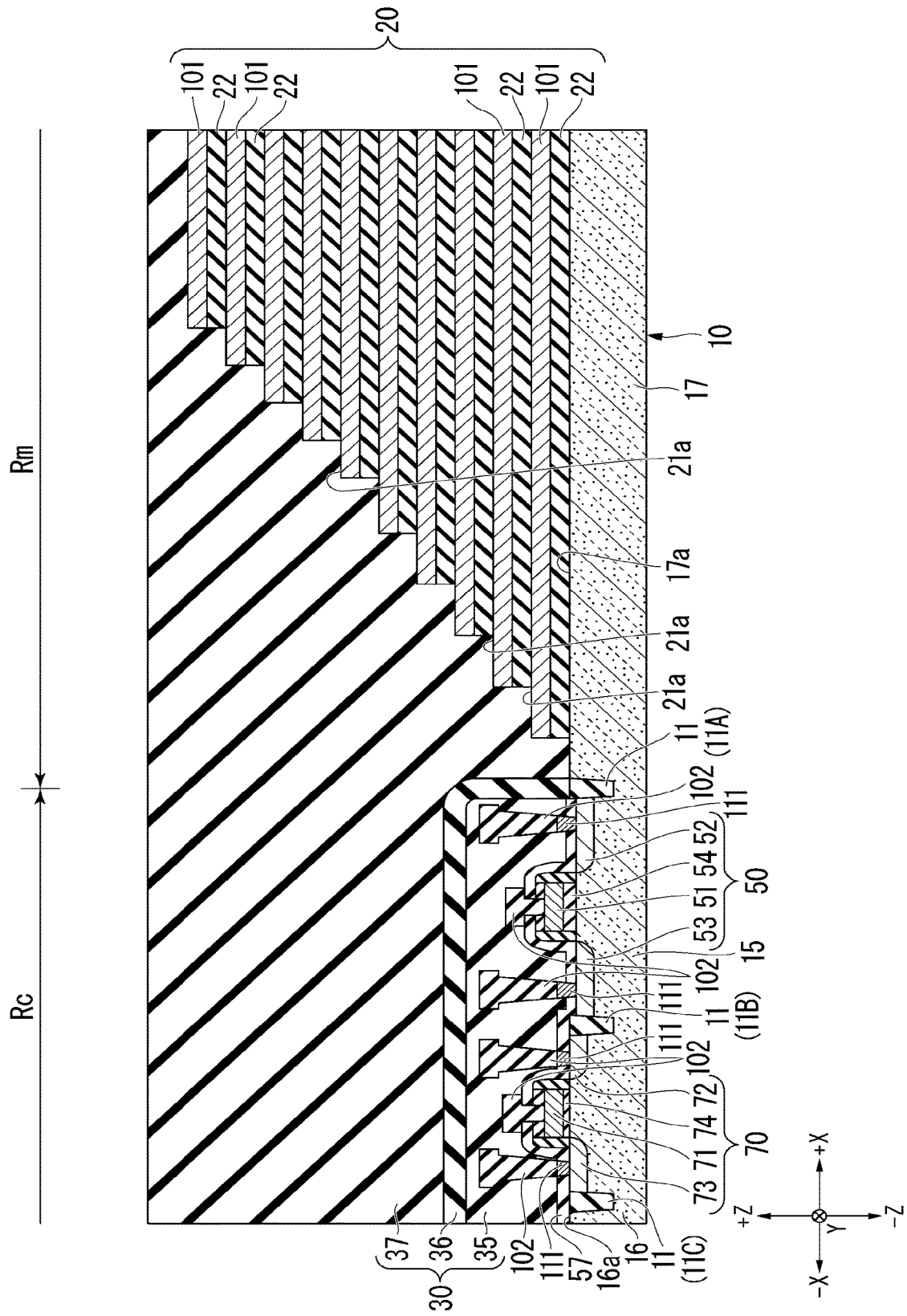
FIG. 26 is a cross-sectional view showing the method of manufacturing the integrated circuit device of the third embodiment.

Then, the stack 20 and the insulation layer 30 are formed, as shown in FIG. 26. The stack 20 is formed in the region corresponding to the memory region Rm of the semiconductor substrate 10 using the same method as that of the first embodiment. The third layer 37 is formed to cover the stack 20 and the second layer 36. The third layer 37 is formed, for example, using the same method as the first portion 35A. The first layer 35, the second layer 36 and the third layer 37 are laminated to form the insulating layer 30.

Figure 27:
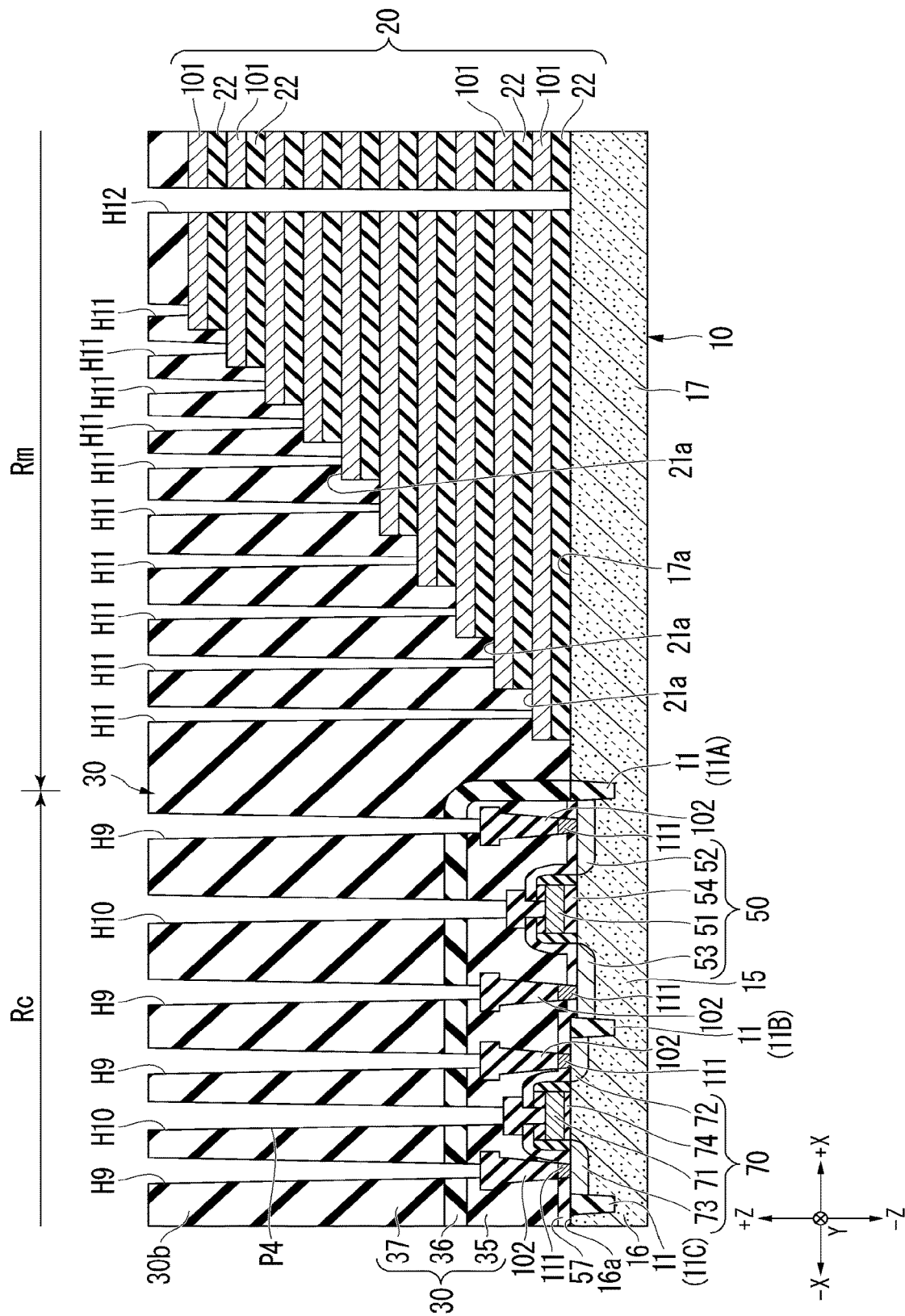
FIG. 27 is a cross-sectional view showing the method of manufacturing the integrated circuit device of the third embodiment.

Then, holes H9, H10, H11, and H12 are formed, as shown in FIG. 27. The holes H9, H10, H11, and H12 are processed using a lithography method and a reactive ion etching (RIE) method. The holes H9 and H10 are formed in the circumferential circuit region Rc. The holes H11 and H12 are formed in the memory region Rm. The holes H9 and H10 penetrates the first layer 35, the second layer 36, and the third layer 37 and reach an upper surface of the sacrificial materials 102, respectively. The holes H11 extend from an upper surface of the insulation layer 30 to an upper surface of the replacement materials 101 corresponding to the terrace 21a, respectively. The holes H12 extend from the upper surface of the insulation layer 30 to the third substrate portion 17 via the stack 20.

Then, the replacement materials 101 of the stack 20 are removed by wet etching. Spaces from which the replacement materials 101 have been removed are filled with a conductive materials and a conductive films 21 is formed. Further, the sacrificial materials 102 are removed through the holes H9 and H10. The holes H9, H10, H11, and H12 are filled with a conductive materials, and the integrated circuit device 5 shown in FIG. 19 is manufactured. The manufacturing process shown herein is an example, and another process may be inserted between the respective processes.

With such a configuration, it is possible to achieve an improved operation speed and a small size, as in the first embodiment. In the embodiment, since the contacts 80 and 90 have the junction portion JT or the second junction portion JT2 at a position closer to the semiconductor substrate 10 than to the second layer 36, it becomes easy to compensate for positional deviation of the holes H9 and H10 with respect to the sacrificial materials 102 at the time of forming the holes H9 and H10.

Figure 28:
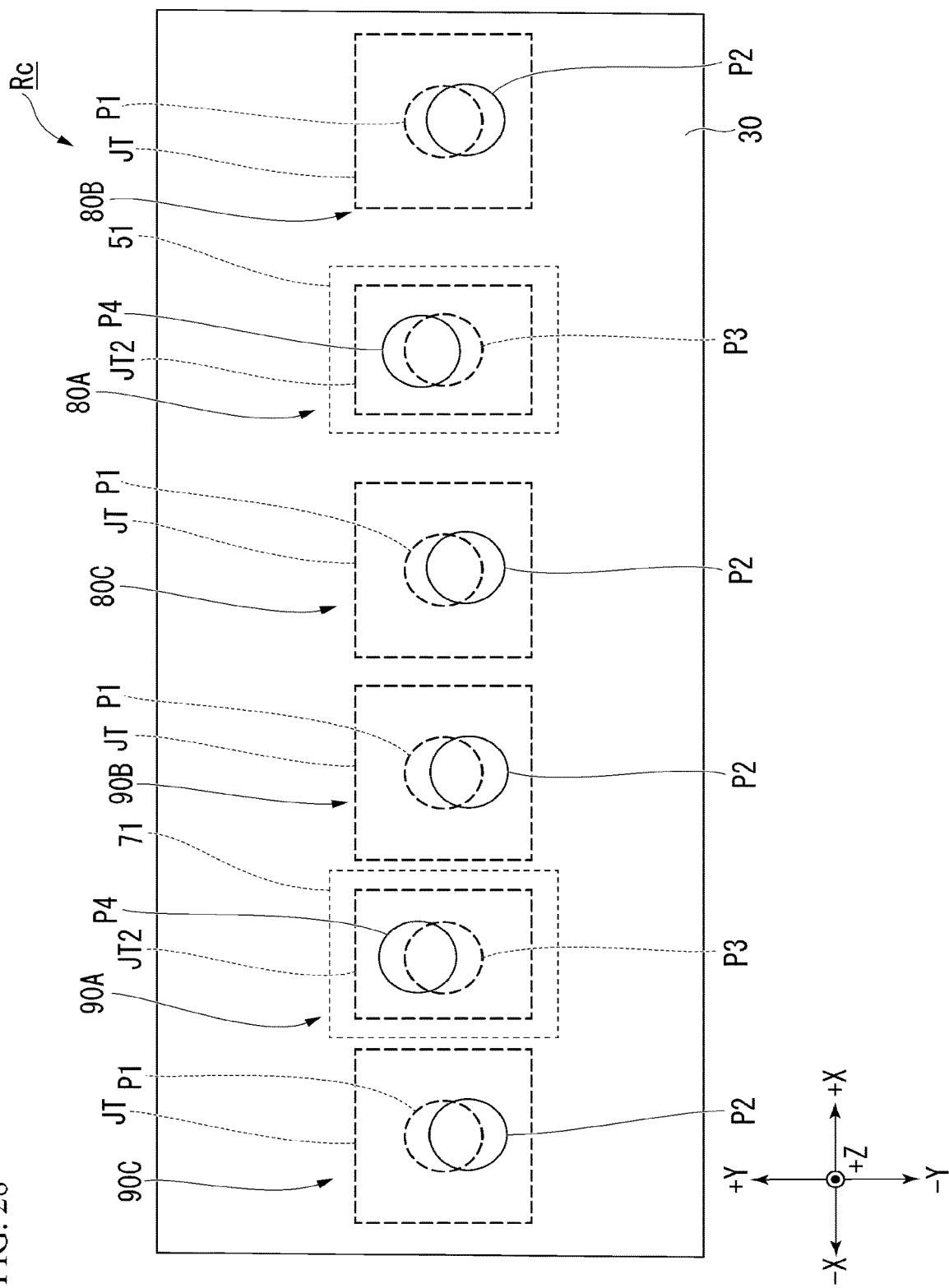
FIG. 28 is a plan view of another example of the circumferential circuit region in the third embodiment.

FIG. 28 is a plan view of another example of the circumferential circuit region Rc according to the third embodiment. In contacts 80B, 80C, 90B, and 90C shown in FIG. 28, positions of the first columnar portion P1 and the second columnar portion P2 in a Y direction are different. For example, positions of an upper end P1a of a first columnar portion P1 and a lower end P2a of a second columnar portion P2 in a Y direction are different. In contacts 80A and 90A shown in FIG. 28, positions of a third columnar portion P3 and a fourth columnar portion P4 in the Y direction are different. For example, positions of an upper end P3a of the third columnar unit P3 and a lower end P4a of the fourth columnar unit P4 in the Y direction are different. Positional deviation between the first columnar portion P1 and the second columnar portion P2 is positional deviation between the holes H9 and the sacrificial materials 102 at the time of forming holes H9. Positional deviation between the third columnar portion P3 and the fourth columnar portion P4 is positional deviation between holes H10 and the sacrificial materials 102 at the time of forming holes H10.

Widths of the junction portion JT in the X direction and the Y direction are greater than widths of the first columnar portion P1 and the second columnar portion P2 in the X direction and the Y direction, respectively. Therefore, even when a position of the second columnar portion P2 deviates from the first columnar portion P1, the second columnar portion P2 is connected to the junction portion JT, and a likelihood of the second columnar portion P2 short-circuiting with the first gate electrode 51 or the gate electrode 71 is reduced. Further, the compensation of the positional deviation between the first columnar portion P1 and the second columnar portion P2 and the compensation of the positional deviation between the third columnar portion P3 and the fourth columnar portion P4 are not limited to the compensation in the Y direction and may be compensation in any direction (for example, the X direction) in a XY plane.

Third Modification Example

Figure 29:
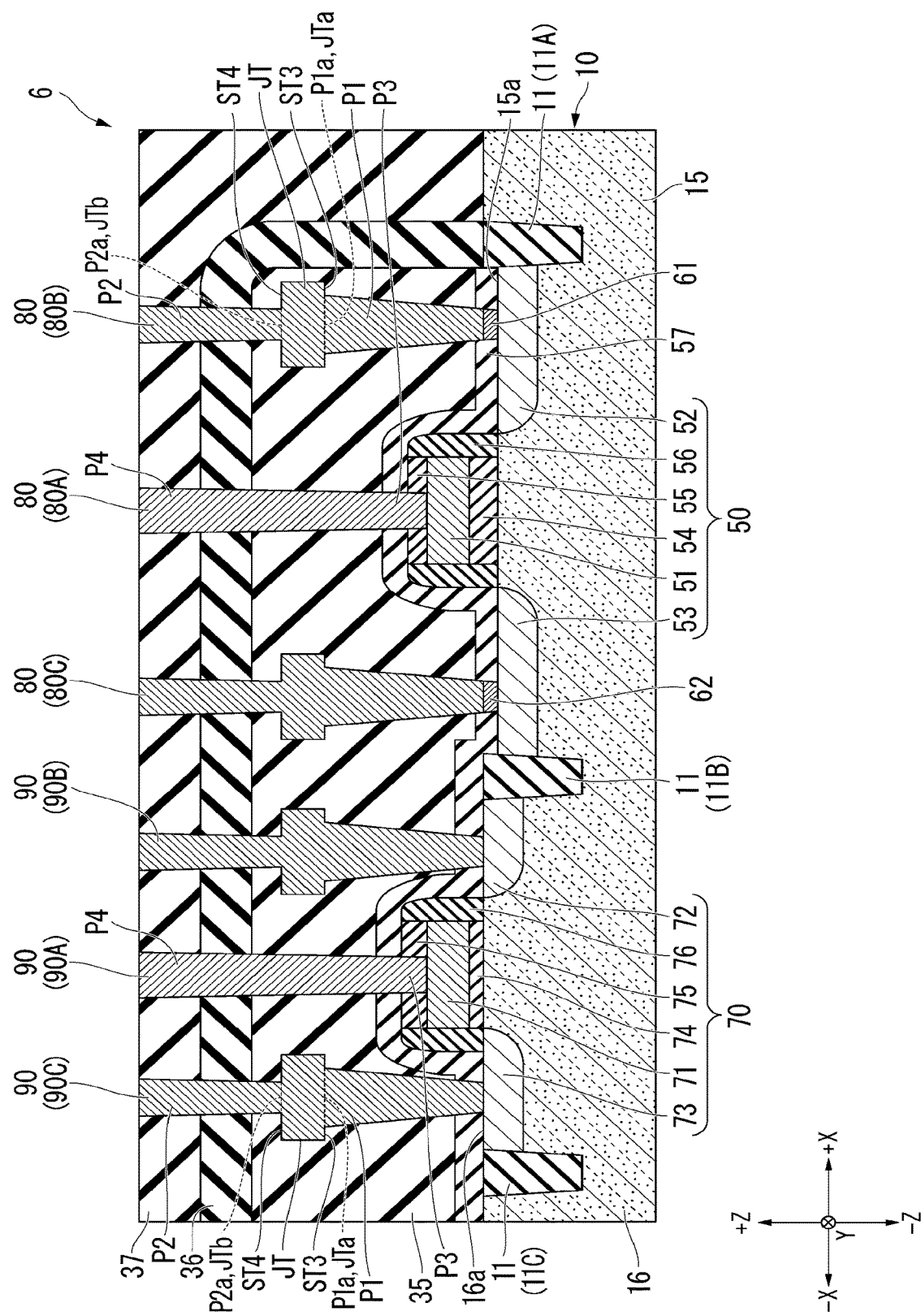
FIG. 29 is a cross-sectional view showing an integrated circuit device of a third modification example of the third embodiment.

Next, a third modification example of the embodiment will be described. FIG. 29 is an enlarged cross-sectional view of the vicinity of a first transistor 50 and a second transistor 70 of an integrated circuit device 6 according to a third modification example of the third embodiment. The integrated circuit device 6 according to the third modification example of the third embodiment differs from the integrated circuit device 5 shown in FIG. 20 in a structure of the contacts 80A and 90A. A configuration other than that to be described below is the same as that of the first embodiment.

In the present modification example, the contacts 80A and 90A do not have the second junction portion JT2. The contact 80A change continuously in widths in the X direction and the Y direction from a surface of the first gate electrode 51 to the upper surface of the insulation layer 30 in the Z direction. The contact 90A change continuously in widths in the X direction and the Y direction from a surface of the second gate electrode 71 to the upper surface of the insulation layer 30 in the Z direction.

With such a configuration, it is possible to achieve an improved operation speed and a small size, as in the first embodiment. Further, in the third modification example, since the contacts 80B, 80C, 90B, and 90C have the junction portion JT at a position closer to the semiconductor substrate 10 than to the second layer 36, it becomes easy to compensate for the positional deviation of the holes H9 with respect to the sacrificial materials 102 at the time of forming the holes H9, respectively.

Although the embodiment and some modification examples have been described above, the embodiments are not limited to the above example. For example, the conductive films 21 and the insulation films 22 may be stacked from the beginning instead of the replacement materials 101 being provided. The contacts 80B, 80C, 90B, and 90C may be formed in one step without having the two columns P1 and P2, similar to the contacts 80A and 90A. Further, terms "first . . . " and "second . . . " used in the present specification are given for convenience of description and other terms may be used.

While some embodiments of the present invention have been described, these embodiments have been presented by way of example and are not intended to limit the scope of the invention. These embodiments can be implemented in various other forms, and various omissions, replacements, and changes can be made without departing from the gist of the invention. These embodiments or modifications thereof are included in the inventions described in the claims and equivalents thereof as the embodiments or modifications are included in the scope or the gist of the invention.

REFERENCE SIGNS LIST 1, 2, 3, 4 Integrated circuit device
10 Substrate
15 First substrate portion
16 Second substrate portion
ST1 Step of semiconductor substrate
20 Stack
21 Conductive film
22 Insulation film
30 Insulation layer
35 First layer
36 Second layer
37 Third layer
50 First transistor
51 First gate electrode
52 First source region
53 First drain region
54 First gate insulation film
61 First single crystal portion
62 Second single crystal portion
70 Second transistor
71 Second gate electrode
72 Second source region
73 Second drain region
74 Second gate insulation film
80, 80A, 80B, 80C, 90, 90A, 90B, 90C Contact
P1 First columnar portion
P2 Second columnar portion
P3 Third columnar portion
P4 Fourth columnar portion
JT Junction portion
JT2 Second junction portion

What is claimed is:
1. An integrated circuit device comprising:
a substrate;
a first transistor having a first gate electrode, a first source region and a first drain region, and wherein the first source region and the first drain region are disposed in the substrate;
an insulation layer disposed on the substrate;
a first contact disposed in the insulation layer and facing the first gate electrode;
a second contact disposed in the insulation layer and facing a first region that is a first one of the first source region and the first drain region; and
a first single crystal portion disposed on the first region and is convex from a surface of the first region, and located between the first region and the second contact,
wherein the substrate includes a first substrate portion disposed with the first transistor, and a second substrate portion thicker than the first substrate portion, and the substrate includes a step at a boundary between the first substrate portion and the second substrate portion, and
a height of the first single crystal portion is equal to or smaller than a height of the step.

2. The integrated circuit device of claim 1, further comprising:
a third contact disposed in the insulation layer and facing a second region that is a second one of the first source region and the first drain region; and
a second single crystal portion disposed on the second region apart from the first single crystal portion and is convex from a surface of the second region, and located between the second region and the third contact.

3. The integrated circuit device according to claim 1, wherein the first single crystal portion contains impurities as donors or acceptors.

4. The integrated circuit device according to claim 1, wherein the first single crystal portion includes an n- type semiconductor.

5. The integrated circuit device according to claim 1, further comprising:
a second transistor disposed in the second substrate portion, the second transistor having a second gate electrode, and a second source region and a second drain region disposed in the substrate;
a fourth contact disposed in the insulation layer and facing the second gate electrode; and
a fifth contact disposed in the insulation layer and facing a third region that is a first one of the second source region and the second drain region and being in direct contact with the third region.

6. The integrated circuit device according to claim 5, further comprising:
a stack of a plurality of conductive films and a plurality of insulation films; and
a column disposed in the stack and the column including a semiconductor body, and a charge storage film disposed between the semiconductor body and the plurality of conductive films,
wherein there is a first distance between a conductive film farthest from the substrate among the plurality of conductive films and the substrate in a first direction toward the stack from the substrate,
the fifth contact has a step in a range of the first distance from a surface of the substrate in the first direction and changes discontinuously at the step in width in a second direction different from the first direction, and
the fourth contact changes continuously in width in the second direction at least in the range of the first distance from the surface of the substrate in the first direction.

7. The integrated circuit device according to claim 5, wherein the fifth contact includes a first columnar portion and a second columnar portion,
the first columnar portion is disposed between the substrate and the second columnar portion in the first direction, and includes a first end that is in contact with the second columnar portion,
the second columnar portion includes a second end that is in contact with the first columnar portion, and a width of the first end of the first columnar portion is greater than a width of the second end of the second columnar portion in the second direction different from the first direction.

8. The integrated circuit device according to claim 5, wherein the fifth contact includes a first columnar portion, a second columnar portion, and a junction portion, the first columnar portion, the junction portion, and the second columnar portion are disposed in this order in the first direction, the junction portion includes a first end that is in contact with the second columnar portion, the second columnar portion includes a second end that is in contact with the junction portion, and a width of the first end of the junction portion is greater than a width of the second end of the second columnar portion in the second direction different from the first direction.

9. The integrated circuit device according to claim 8, wherein the first columnar portion includes a first end that is in contact with the junction portion, and positions of the second end of the second columnar portion and the first end of the first columnar portion are different when viewed in the first direction.

10. The integrated circuit device according to claim 8, wherein the insulation layer includes a first layer, a second layer, and a third layer, the first layer, the second layer, and the third layer are arranged in this order from the substrate, the first columnar portion and the junction portion are disposed in the first layer, and the second columnar portion penetrates the third layer, the second layer, and at least a portion of the first layer.

11. The integrated circuit device according to claim 8, wherein the fourth contact includes a third columnar portion, a fourth columnar portion, and a second junction portion, the third columnar portion, the second junction portion, and the fourth columnar portion are disposed in this order in the first direction, the third columnar portion and the second junction portion are disposed in the first layer, the fourth columnar portion is penetrates the third layer, the second layer, and at least a portion of the first layer, and positions of the junction portion and the second junction portion are different in the first direction.

12. The integrated circuit device according to claim 5, wherein the insulation layer includes a first laver, a second layer, and a third layer, the first layer, the second layer, and the third layer are disposed in this order from the substrate, the fourth contact includes a third columnar portion, a fourth colunnar portion, and a second junction portion, the third colunnar portion, the second junction portion, and the fourth columnar portion are disposed in this order in the first direction, the third colunnar portion and the second junction portion are disposed in the first layer, the fourth columnar portion is penetrates the third layer, the second layer, and at least a portion of the first layer, the second junction portion includes a first end that is in contact with the fourth columnar portion, the fourth columnar portion includes a second end that is in contact with the second junction portion, and a width of the first end of the second junction portion is greater than the width of e second end of the fourth columnar portion in the second direction different from the first direction.

13. The integrated circuit device according to claim 12, wherein the third columnar portion includes a first end that is in contact with the second junction portion, and positions of the second end of the fourth columnar portion and the first end of the third columnar portion are different when viewed in the first direction.

14. The integrated circuit device according to claim 5, wherein the second gate electrode includes a first end that is in contact with the fourth contact, the fourth contact includes a second end that is in contact with the second gate electrode, and a width of the second end of the second gate electrode is greater than a width of the first end of the fourth contact in the second direction different from the first direction.

15. The integrated circuit device according to claim 1, further comprising:

a stack of a plurality of conductive films and a plurality of insulation films; and a column disposed in the stack and including a semiconductor body, and a charge storage film disposed between the semiconductor body and the plurality of conductive films, wherein there is a first distance between a conductive film farthest from the substrate among the plurality of conductive films and the substrate in a first direction toward the stack from the substrate, the second contact has a step in a range of the first distance from a surface of the substrate in the first direction and changes discontinuously at the step in width in a second direction different from the first direction, and the first contact changes continuously in width in the second direction at least in the range of the first distance from the surface of the substrate in the first direction.

* * * * *